United States Patent
Fukuda et al.

(10) Patent No.: US 7,656,249 B2
(45) Date of Patent: Feb. 2, 2010

(54) MATCHING CIRCUIT

(75) Inventors: Atsushi Fukuda, Yokosuka (JP); Hiroshi Okazaki, Zushi (JP); Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 0 days.

(21) Appl. No.: 12/115,853

(22) Filed: May 6, 2008

(65) Prior Publication Data

US 2008/0278260 A1 Nov. 13, 2008

(30) Foreign Application Priority Data

May 10, 2007 (JP) ............................. 2007-125410

(51) Int. Cl.
*H03H 7/38* (2006.01)
(52) U.S. Cl. ...................................... 333/33
(58) Field of Classification Search ............... 333/32, 333/33
See application file for complete search history.

(56) References Cited

U.S. PATENT DOCUMENTS

| | | | |
|---|---|---|---|
| 6,023,611 | A | 2/2000 | Bolin et al. |
| 6,078,794 | A | 6/2000 | Peckham et al. |
| 2006/0202764 | A1 | 9/2006 | Fukuda et al. |
| 2006/0261911 | A1 | 11/2006 | Fukuda et al. |
| 2007/0018758 | A1 | 1/2007 | Fukuda et al. |
| 2007/0115065 | A1 | 5/2007 | Fukuda et al. |
| 2008/0100383 | A1 | 5/2008 | Fukuda et al. |

OTHER PUBLICATIONS

Koji Chiba et al., "Mobile Terminals", NTT DoCoMo Technical Journal vol. 4, No. 1, Nov. 2001, pp. 6.

Atsushi Fukuda et al., "Multi-band power Amplifier Employing MEMS Switches for Optimum Matching", C-2-4, Proceedings of Institute of Electronics, Information and Communication Engineers General Conference, 2004, pp. 2 (with Partial English Translation).

Atsushi Fukuda et al., "Power Amplifier for Broadband Applications Beyond the Third Generation—Multi-band, High-efficiency Power Amplifier using MEMS switches for Mobile Terminals - - - ", NTT DoCoMo Technical Journal vol. 8, No. 3, Oct. 2006, pp. 8.

Atsushi Fukuda, et al., "A Novel Compact Reconfigurable Quad-band Power Amplifier Employing RF-MEMS Switches", Proceedings of the 36th European Microwave Conference, IEEE, PI, XP031005571, Sep. 1, 2006, pp. 344-347.

Atsushi Fukuda, et al., "A 0.9-5-GHz Wide-Range 1W-Class Reconfigurable Power Amplifier Employing RF-MEMS Switches", Microwave Symposium Digest, 2006. IEEE MTT-S International, IEEE, PI, XP031018853, Jun. 1, 2006, pp. 1859-1862.

Atsushi Fukuda, et al. "Novel Band-Rconfigurable High Efficiency Power Amplifier Employing RF-MEMS Switches", IEICE Transactions on Electronics Society, XP001236733, vol. E88-C, No. 11, Nov. 1, 2005, pp. 2141-2149.

*Primary Examiner*—Stephen E Jones
(74) *Attorney, Agent, or Firm*—Oblon, Spivak, Maier & Neustadt, L.L.P.

(57) ABSTRACT

First, second and third matching parts 110, 120, and 130 are connected in series between a circuit element 199 whose impedance has a frequency characteristic and a circuitry 198 having a constant impedance. The second matching part 120 has the capability of converting impedances. The first matching part 110 operates as an element having reactance values according to any of frequency bands selected by exclusive switching between on and off of switches 118, 119 and the third matching part 130 operates as an element having reactance values according to any of the frequency bands selected by switching between on and off of a switch 133, thereby providing matching in each frequency band. A seventh reactance circuit 131 is configured on the basis of an interdependence relation with the configuration of a fifth reactance circuit 115 and an eighth reactance circuit 132.

10 Claims, 15 Drawing Sheets

MATCHING CIRCUIT

BACKGROUND OF THE INVENTION

1. Field of the Invention

The present invention relates to a matching circuit used for a circuit element such as an amplifier and, in more specifically, to a matching circuit capable of matching the input/output impedance of a circuit element, such as an amplification device, that has a frequency characteristic to a particular impedance in each of two or more frequency bands.

2. Description of the Related Art

With the diversification of services provided by radio communications, multiband operation of radio devices is required. Among essential devices included in radio devices is a power amplifier. For an efficient amplification, a matching circuit for matching the input/output impedance of an amplification device having a frequency characteristic to the input/output impedance $Z_0$ of peripheral circuitry (hereafter referred to as the system impedance $Z_0$), namely a multiband matching circuit, is required.

FIG. 1 shows an example of input/output scattering parameters (S parameters) of an amplification device, where the upper limit of measured frequencies is denoted by $f_{max}$ and the lower limit is denoted by $f_{min}$. In FIG. 1, $S_{11}$ is the input reflection coefficient of the amplification device at an output impedance of 50Ω and $S_{22}$ is the output reflection coefficient of the amplification device at an input impedance of 50Ω. The input/output impedance of the amplification device can be obtained from the S parameters and the system impedance $Z_0$. Accordingly, as apparent from FIG. 1, the input/output impedance of the amplification device has a frequency characteristic. Therefore, the input/output impedance of the amplification device is represented by a function, $Z_L(f)$, as an input/output impedance that is dependent on frequency f. A multiband matching circuit is a circuit that matches the impedance of a circuit element having a frequency characteristic, such as an amplification device, to the system impedance $Z_0$ in each of desired frequency bands. In the following description, an amplification device will be adopted as a representative example of circuit elements whose impedances have a frequency-dependent characteristic.

Typical matching circuits are often formed by a combination of circuit elements such as a capacitor and an inductor. However, it is not straightforward to form a multiband matching circuit by using circuit elements because each circuit element has a unique frequency characteristic. Therefore, for example there are two possible ways to configure an amplifier that operates in different frequency bands: [1] a method in which amplifiers, each designed for any one of the predetermined frequency bands, are provided and any one of the amplifiers are selected by switches corresponding to an operating frequency band of the predetermined frequency bands, and [2] a method that takes into account the characteristic of an amplification device that can amplify wideband signals, in which a single amplification device and a matching circuit capable of changing a circuit constant thereof are provided, and the circuit constant of the matching circuit is changed in accordance with operating frequency bands. As the method [2], approaches have been proposed in which low-loss switches and variable-capacitance elements developed in recent years are used to change the circuit constant of the matching circuit.

An example of [1] is a power amplifier described in non-patent literature 1 (Koji Chiba et. al, "Mobile Terminals", NTT DoCoMo, Vol. 4, No. 1, pp. 14-19). FIG. 2 shows a circuit configuration of a power amplifier (dualband power amplifier 900) capable of amplifying each signal in two frequency bands. The center frequencies of the two operating frequency bands are $f_1$=1.5 GHz and $f_2$=0.8 GHz. Matching circuits generally can perform impedance matching for signals in a certain frequency band around a certain center frequency. The dualband power amplifier 900 includes an amplifier 921 designed specifically for a frequency band with center frequency $f_1$, and an amplifier 922 designed specifically for a frequency band with center frequency $f_2$, as shown in FIG. 2. In the dualband amplifier 900, a single-pole double-throw (SPDT) switch 911 connected to an input terminal 931 and an SPDT switch 912 connected to an output terminal 932 are turned on or off depending on which of the center frequencies $f_1$ and $f_2$ is used, thereby selecting one of the amplifiers 921 and 922.

However, the concept of [1] requires as many amplifiers as the number of frequency bands to be used. If many frequency bands are to be used, a large number of components must be provided, resulting in a large circuitry size. The increase in the number of components leads not only to a large device size but also to an increase in power consumption in the entire circuitry.

An example of [2] is a matching circuit 950 disclosed in non-patent literature 2 (Fukuda et. al, "Multiband Power Amplifier Employing MEMS Switches for Optimum Matching", Proceedings of Institute of Electronics, Information and Communication Engineers General Conference 2004, C-2-4. p. 39) (see FIG. 3). The matching circuit 950 includes a main matching block 951, a delay circuit 952 one end of which is connected to the main matching block 951, an auxiliary matching block 953 connected to the other end of the delay circuit 952 through a switching element 954.

The matching circuit 950 shown in FIG. 3 matches the impedance $Z_L(f)$ of a load (a circuit element) 955 connected to port $P_2$ to the constant impedance $Z_0$ of a load (a circuitry) 956 connected to port $P_1$ and functions as a matching circuit for each of signals in two frequency bands with center frequencies $f_1$ and $f_2$, for example. The mechanism of the operation will be described below.

First, for impedance matching in the frequency band with center frequency $f_1$, the switching element 954 is turned off (brought into the non-conduction state). The main matching block 951 is a circuit that converts the impedance $Z_L(f_1)$ of the load 955 to the impedance $Z_0$ of the load 956 for a signal in the frequency band with center frequency $f_1$. Here, by implementing the delay circuit 952 by, for example, a transmission line of the characteristic impedance $Z_0$, impedance matching by the matching circuit 950 as a whole can be achieved for the frequency band with center frequency $f_1$ because the impedance as viewed from port $P_1$ toward point A shown in FIG. 3 becomes $Z_0$.

For impedance matching in the frequency band with center frequency $f_2$, the switching element 954 is turned on (brought into the conducting state). The main matching block 951 designed as described above functions as an impedance converter for a signal in the frequency band with center frequency $f_2$ and the impedance as viewed from point A toward port $P_2$ becomes $Z(f_2)$ converted from the impedance $Z_L(f_2)$ of the load 955. Here, the impedance as viewed from port $P_1$ toward port $P_2$ can be converted to $Z_0$ on the basis of the principle of single stub matching by choosing an appropriate line length of the delay circuit 952 implemented by a transmission line and an appropriate reactance value of the auxiliary matching block 953 branch-connected to the transmission line whatever value the impedance $Z(f_2)$ has. That is, in the matching circuit 950 as a whole, impedances can be matched for the frequency band with center frequency of $f_2$ as well.

With the configuration of the matching circuit 950 which comprises the delay circuit 952 of the characteristic impedance $Z_0$ and the auxiliary matching block 953 connectable by the switching element 954 as well as the main matching block 951 which is a matching circuit for the frequency band with center frequency $f_1$, the matching circuit 950 functions as a dualband matching circuit for a signal in the frequency band with center frequency $f_1$ when the switching element 954 is in the off state and for a signal in the frequency band with center frequency $f_2$ when the switching element 954 is in the on state. That is, the matching circuit 950 functions as a matching circuit for each of the signals in the two frequency bands by turning on or off the single switching element 954.

In the matching circuit 950, the amount of delay in the delay circuit 952 needs to be increased, depending on the frequency characteristic of the input/output impedance of an amplification device. If the delay circuit 952 is implemented by a transmission line, the matching circuit 950 will increase in size because the length of the transmission line is proportional to the amount of delay. The size of the matching circuit 950 will be more likely to increase because a plurality of delay circuits and auxiliary matching blocks are provided if the number of the operating frequencies is three or more. By the way, a circuit equivalent to the delay circuit 952 could be formed by a set of small lumped-parameter elements. However, it is very difficult to design a delay circuit that is capable of adjusting the amount of delay under the condition that the impedance $Z_0$ should be sustained in each of multiple frequency bands. For these reasons, reduction of the size (shortening of the transmission line) of the part equivalent to the delay circuit is required in order to reduce the size of the multiband circuit in the matching circuit as shown in FIG. 3.

SUMMARY OF THE INVENTION

Therefore, an object of the present invention is to provide a matching circuit that is capable of impedance matching in each of N frequency bands and can be designed small in size, where N is a predetermined integer greater than or equal to 2.

A matching circuit according to the present invention includes a first matching part one end of which is connected to a circuit element whose impedance has a frequency characteristic, a second matching part one end of which is connected to the other end of the first matching part, and a third matching part one end of which is connected to the other end of the second matching part and the other end of which is connected to a circuit having a constant impedance (a circuitry), wherein: the first matching part includes at least one switch and a plurality of reactance circuits and has reactance values obtained by one or more reactance circuits determined by the conduction/non-conduction state of each of the switches corresponding to each of the frequency bands; the second matching part is an impedance converter operating in each of the frequency bands; and the third matching part includes one or more reactance circuits (series reactance circuits) connected in series between one end of the third matching part and the other end of the third matching part and one or more reactance circuits (parallel reactance circuits) each connected to a connection point between adjacent two of the series reactance circuits or between one of the series reactance circuits and the other end of the third matching part through a switch, and the third matching part has reactance values obtained by the series reactance circuits or by the series reactance circuits and the parallel reactance circuits that are determined by the conduction/non-conduction state of each switch of the third matching part that corresponds to each frequency band; the series reactance circuits of the third matching part are configured at least on the basis of interdependence relation with a configuration of the reactance circuits of the first matching part and the parallel reactance circuits of the third matching part that correspond to each frequency band.

In the matching circuit, the matching parts are connected between the circuit element and the circuitry and the first and third matching parts function as reactance elements having reactance values that are determined by the conduction/non-conduction state of each switch corresponding to each of the frequency bands, thereby accomplishing impedance matching for each of the N frequency bands. Since the configuration of the series reactance circuits of the third matching part is in an interdependence relation with at least the configuration of the reactance circuits of the first matching part and the parallel reactance circuits of the third matching part corresponding to each frequency band, there is a designer's discretion with respect to the configurations of the series reactance circuits of the third matching circuit.

EFFECTS OF THE INVENTION

The matching circuit of the present invention is capable of performing impedance matching for each of N frequency bands because the first and third matching parts function as reactance elements having reactance values for each of the frequency bands. Furthermore, because there is a designer's discretion with respect to the configurations of the series reactance circuits of the third matching part, the series reactance circuits are not subject to constraints of the input/output impedances of the circuit element having a frequency characteristic. Therefore, the matching circuit can be designed small by designing the series reactance circuits of the third matching section small.

DETAILED DESCRIPTION

Figure 1:
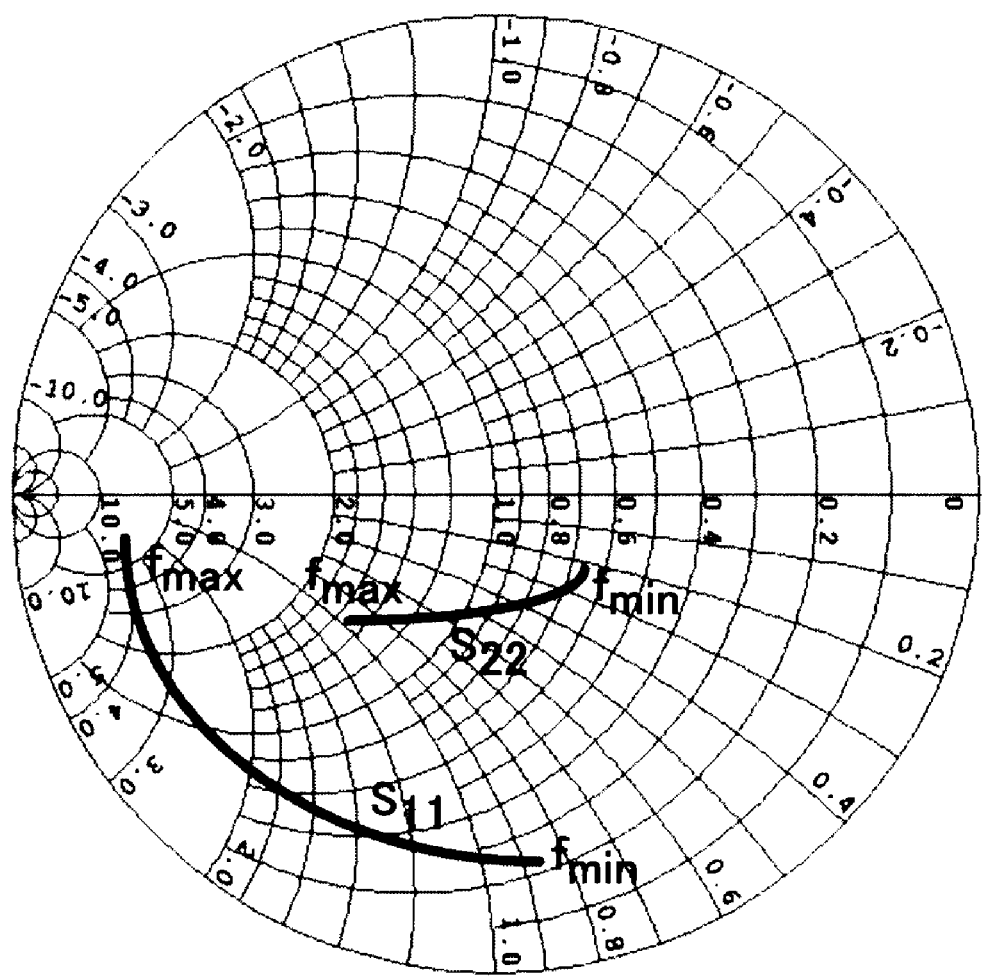
FIG. 1 shows a frequency characteristic of the input/output impedances of an amplification device.
Figure 2:
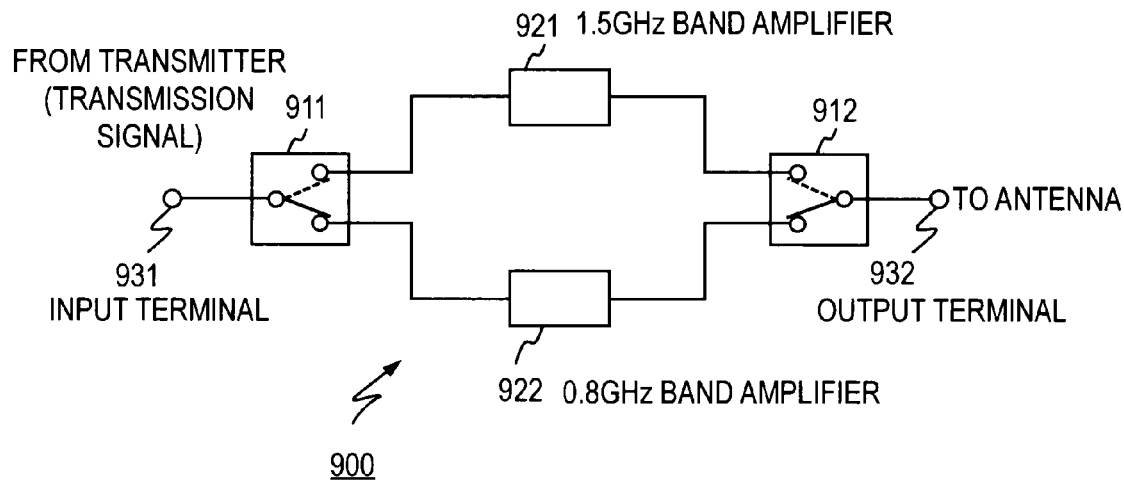
FIG. 2 shows an exemplary circuit configuration of a power amplifier (dualband power amplifier) capable of amplifying signals in two frequency bands.

Embodiments of the present invention will be described with reference to the accompanying drawings. Like or corresponding elements are given like reference numerals throughout the drawings and repeated description thereof will be omitted.

First Embodiment

Figure 4:
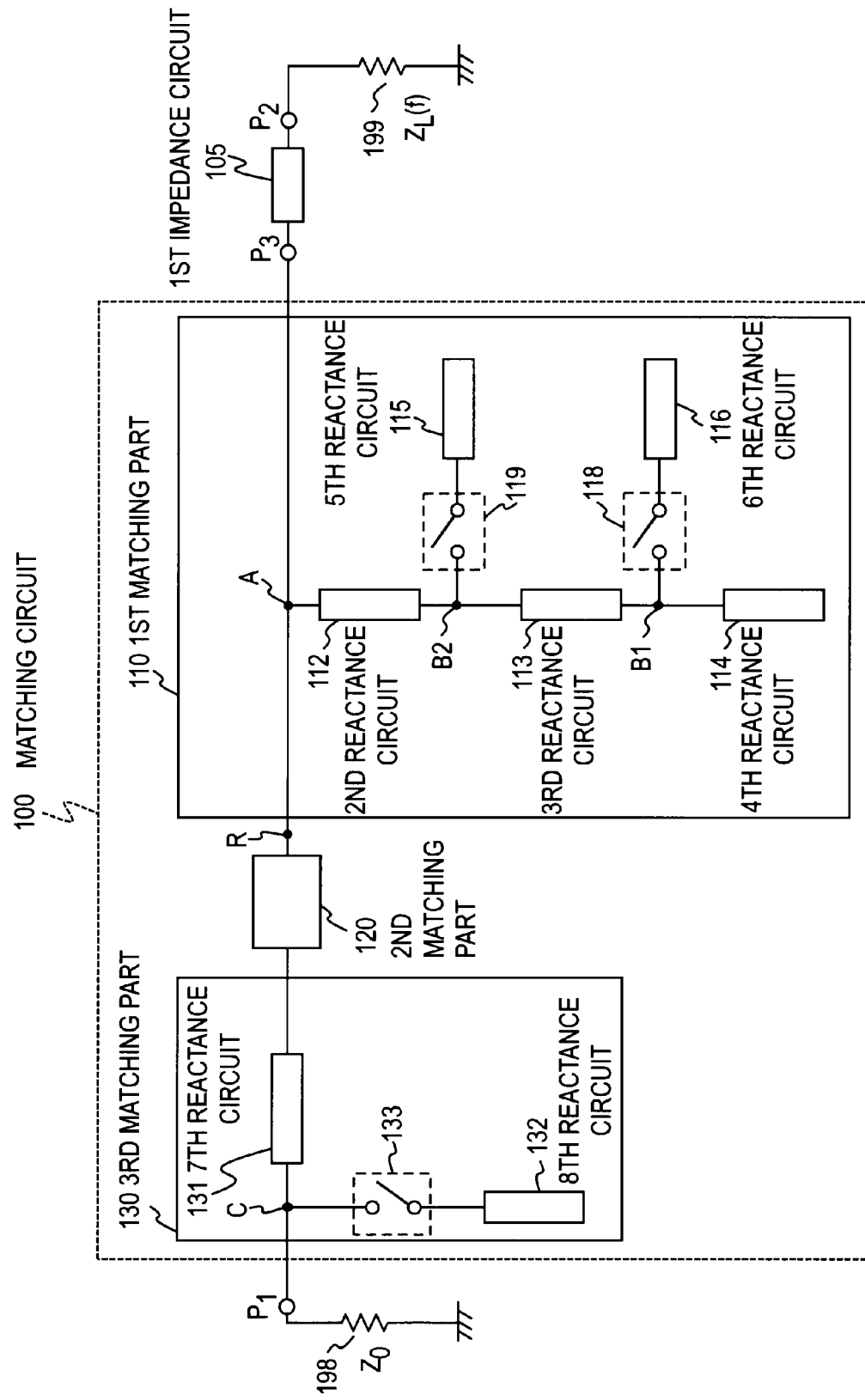
FIG. 4 is a circuit diagram of a matching circuit 100 according to a first embodiment of the present invention.
Figure 5:
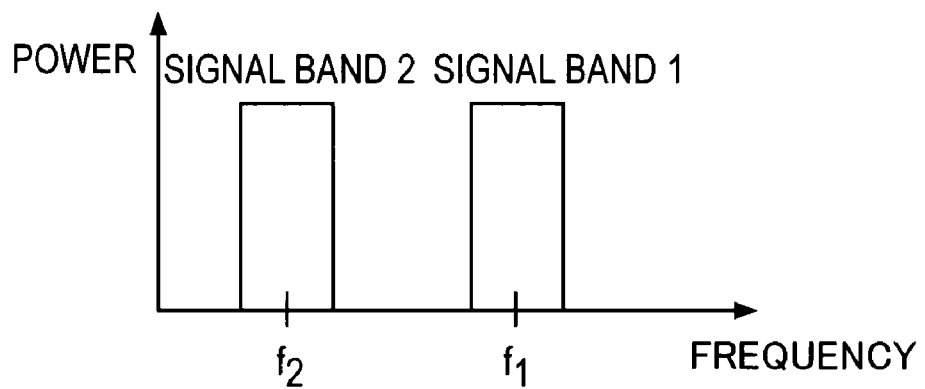
FIG. 5 shows a conceptual diagram showing two frequency bands with center frequencies $f_1$ and $f_2$.

FIG. 4 shows a matching circuit 100 according to a first embodiment. The matching circuit 100 shown in FIG. 4 operates as a matching circuit for each of signals in two frequency bands with center frequencies $f_1$ and $f_2$ ($f_1 > f_2$) shown in FIG. 5. The matching circuit 100 is connected in series between port $P_1$ and port $P_3$. The matching circuit 100 includes a first matching part 110, a second matching part 120, and a third matching part 130, which are connected in series in this order. That is, one end of the first matching part 110 is connected to port $P_3$ to which a first impedance circuit 105 is connected. The other end of the first matching part 110 is connected to one end of the second matching part 120. The other end of the second matching part 120 is connected to one end of the third matching part 130. The other end of the third matching part 130 is connected to port $P_1$.

The first impedance circuit 105 is provided for changing impedance (changing a resistance component is also allowed) between port $P_2$ and port $P_3$ in impedance matching. Whether the first impedance circuit 105 is required or not is determined by the design of the matching circuit 100. If the first impedance circuit 105 is required, the first impedance circuit 105 is formed by e.g. lumped-parameter elements (including a resistance) so that required impedance conversion is achieved. Seen in this light, the first impedance circuit 105 may be included in the matching circuit 100 as a component. However, it does not affect the subject matter of the present invention if the first impedance circuit 105 is not included in the matching circuit 100. Therefore, the matching circuit 100 will be described that it does not include the first impedance circuit 105 as a component, for convenience of explanation.

A load (a circuit element) 199 that is connected in series to port $P_2$ and whose impedance has a frequency characteristic may be exemplified by an amplification device. The input/output impedance of the load 199 is denoted by the function $Z_L(f)$, where f represents the frequency of an AC signal.

Connected to port $P_1$ is a circuitry 198. Here, the input/output impedance of the circuitry 198 that does not depend on frequency (the system impedance) is denoted by $Z_0$. The input/output impedance of the circuitry 198 is typically held at a predetermined constant value $Z_0$, for example 50 or 75Ω. Both of the load 199 and the circuitry 198 are represented by a symbol of resistance in the drawings for convenience.

The first matching part 110 includes a second reactance circuit 112, a third reactance circuit 113, a fourth reactance circuit 114, a fifth reactance circuit 115, a sixth reactance circuit 116, a first switch 118, and a second switch 119.

To put it concretely, one end of the second reactance circuit 112 is connected to the connection point A between the second matching part 120 and the first impedance circuit 105. The other end of the second reactance circuit 112 is connected to one end of the third reactance circuit 113 and the fifth reactance circuit 115 is connected to the connection point B2 between the second reactance circuit 112 and the third reactance circuit 113 through the second switch 119. The other end of the third reactance circuit 113 is connected to one end of the fourth reactance circuit 114 and the sixth reactance circuit 116 is connected to the connection point B1 between the third reactance circuit 113 and the fourth reactance circuit 114 through the first switch 118.

The configuration of the first matching part 110 described here is not inconsistent with the description given above that "the first matching part 110 is connected in series". This is because port $P_3$ and the connection point R between the second matching part 120 and the first matching part 110 are implemented typically by transmission lines in real design.

Specific examples of reactance circuits having reactance values (depending on frequencies) include a single element such as a capacitor, an inductor, or a transmission line, or a combination of the same types of elements belonging among these elements, or a combination of different types of elements belonging among these elements.

The switches used herein, such as the first switch 118 and other switches, are not limited to contact type switches. The switches may be so-called switching elements having the capability of opening and closing a circuit, instead of providing contacts in the circuitry. Specific examples of the switches include MEMS (Micro-Electro Mechanical Systems) switches and switching diodes.

In the first matching part 110, the first switch 118 is turned on and the second switch 119 is turned off in a frequency band with center frequency $f_1$, for example. The first switch 118 is turned off and the second switch 119 is turned on for a frequency band with center frequency $f_2$.

The second reactance circuit 112 has reactance values that can be obtained by a single element or circuit that constitutes the second reactance circuit 112 in impedance matching for each frequency band. The second reactance circuit 112 can be configured at the designer's discretion without any problems because the effects of the reactance values of the second reactance circuit 112 will be considered when designing the sixth reactance circuit 116 and the tenth reactance circuit 122, which will be described later, for the frequency band with center frequency $f_1$ and when designing the fifth reactance circuit 115 and the eighth reactance circuit 132, which will be described later, for the frequency band with center frequency $f_2$.

The fourth reactance circuit 114 is configured so that the impedance as viewed from the connection point B1 between the fourth reactance circuit 114 and the third reactance circuit 113 toward the fourth reactance circuit 114 in the frequency band with center frequency $f_1$ is sufficiently large (the admittance is approximately 0). For example, the fourth reactance circuit 114 may be an end-short-circuited line having an electrical length of 90 degrees at the center frequency $f_1$. The words "impedance is sufficiently large (the admittance is approximately 0)" can be construed to mean that the impedance is large enough that a particular circuit (here the fourth reactance circuit 114) can be considered independently of the AC circuit at the frequency of the impedance matching. The same applies to the words "the impedance is sufficiently large (the admittance is approximately 0)" used in the following description.

Provided that the fourth reactance circuit 114 is configured as described above, the third reactance circuit 113 is configured so that the impedance as viewed from the connection point B2 between the third reactance circuit 113 and the second reactance circuit 112 toward the third reactance circuit 113 is sufficiently large (the admittance is approximately 0). For example, the third reactance circuit 113 may be implemented by a transmission line such that the sum of the electrical lengths of the third reactance circuit 113 and the fourth reactance circuit 114 becomes 90 degrees at the center frequency $f_2$.

With the configuration described above, the fourth reactance circuit 114 does not need to be taken into consideration in the frequency band with center frequency $f_1$ and the third reactance circuit 113 and the fourth reactance circuit 114 do not need to be taken into consideration in the frequency band with center frequency $f_2$.

The fifth reactance circuit 115 may be configured at the designer's discretion by using elements such as lumped-parameter elements or a transmission line as appropriate in the frequency band with center frequency $f_2$ without special restrictions. Similarly, the sixth reactance circuit 116 can be configured at the designer's discretion by using elements such as lumped-parameter elements or a transmission line as appropriate in the frequency band with center frequency $f_1$ without special restrictions.

As a result, the first matching part 110 can function as a different reactance element for each frequency band in response to a simple operation of turning on and off of the first switch 118 and the second switch 119.

From the viewpoint that the first matching part 110 functions as different reactance elements for different frequency bands, one may contemplate a different configuration of the first matching part 110 in which s transmission lines are simply connected in a cascade arrangement through s−1 switches and the number of switches to turn on is changed to change the total length of the transmission lines connected. However, because multiple switches are placed in the on state in this configuration, losses in the matching circuit due to insertion losses of switches would be significant. In the configuration of the first matching part 110, in contrast, only one switch is placed in the on state for any of the frequency bands and therefore switch insertion loss in the matching circuit 100 is small.

The second matching part 120 may be an impedance converter that has the capability of converting impedance in each frequency band. In the present embodiment, the second matching part 120 is a circuit that matches the impedance as viewed from the connection point R between the second matching part 120 and the first matching part 110 toward the first matching part 110 to the system impedance $Z_0$ in one of the frequency bands with center frequency $f_1$ and $f_2$. For convenience of explanation, the second matching part 120 will be described that is configured as a matching circuit that performs impedance matching in the frequency band with center frequency $f_1$.

Figure 3:
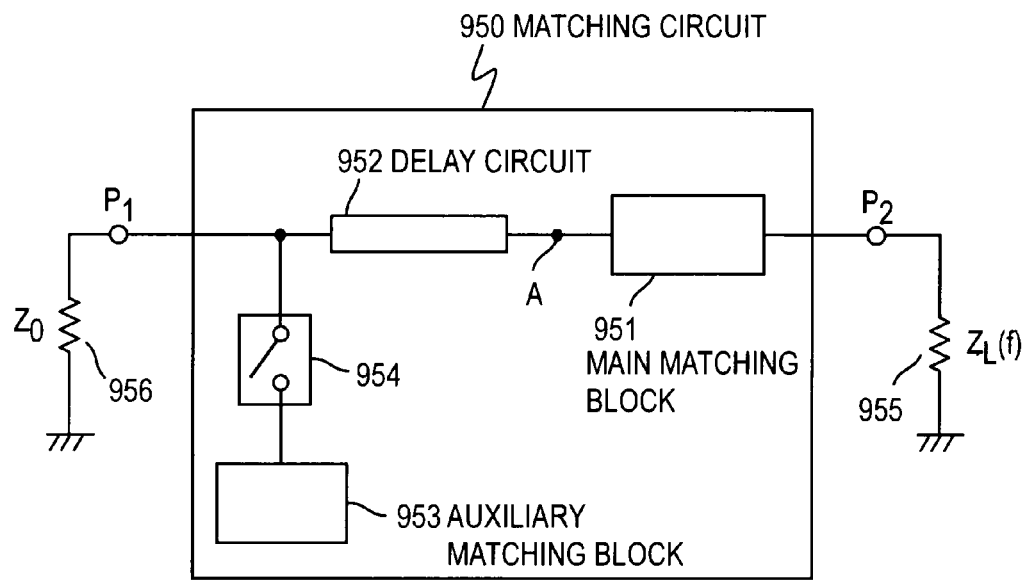
FIG. 3 shows an exemplary circuit configuration of a conventional matching circuit.
Figure 6:
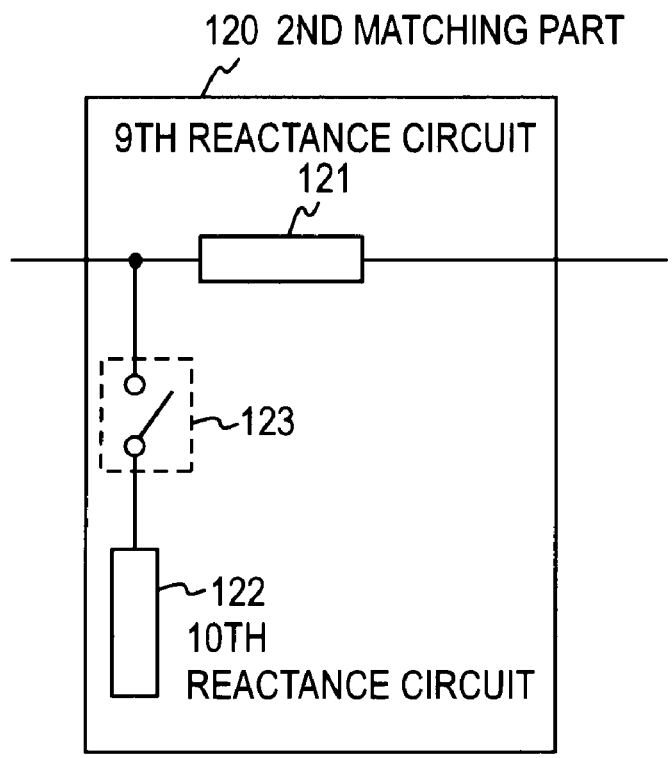
FIG. 6 is a circuit diagram showing an exemplary configuration of a second matching part 120.

The second matching part 120 corresponds to the main matching block 951 in FIG. 3 and can be implemented using a transmission line or lumped-parameter elements like the first matching part 110. As an example, a second matching part 120 configured with a ninth reactance circuit 121, a tenth reactance circuit 122, and a fourth switch 123 is shown in FIG. 6. To put it concretely, the ninth reactance circuit 121 is connected in series between the first matching part 110 and the third matching part 130, and the tenth reactance circuit 122 is connected to the connection point between the ninth reactance circuit 121 and the third matching part 130 through the fourth switch 123.

The fourth switch 123 is turned on in the frequency band with center frequency $f_1$ and turned off in the frequency band with center frequency $f_2$.

The third matching part 130 can be implemented using a transmission line or lumped-parameter elements, like the first matching part 110. As an example, a third matching part 130 configured with a seventh reactance circuit 131, an eighth reactance circuit 132, and a third switch 133 is shown in FIG. 4. To put it concretely, the seventh reactance circuit 131 is connected in series between the second matching part 120 and port $P_1$, and the eighth reactance circuit 132 is connected to the connection point C between the seventh reactance circuit 131 and port $P_1$ through the third switch 133.

The third switch 133 is turned off in the frequency band with center frequency $f_1$ and turned on in the frequency band with center frequency $f_2$.

First, in the frequency band with center frequency $f_1$, the third switch 133 of the third matching part 130 is turned off and the fourth switch 123 of the second matching part 120 is turned on. In the first matching part 110, in this case, the first switch 118 is turned on and the second switch 119 is turned off. The circuit part of the first matching part 110 excluding the fifth reactance circuit 115 (that is, the second, third, fourth, and sixth reactance circuits 112, 113, 114, and 116) and the second matching part 120 together perform impedance matching between the impedance $Z(f_1)$ as viewed from port $P_3$ toward the first impedance circuit 105 and the system impedance $Z_0$. The impedance $Z(f_1)$ is the impedance resulting from the operation of the first impedance circuit 105 functioning as an impedance converter on the input/output impedance $Z_L(f_1)$ of the load 199.

Figure 7:
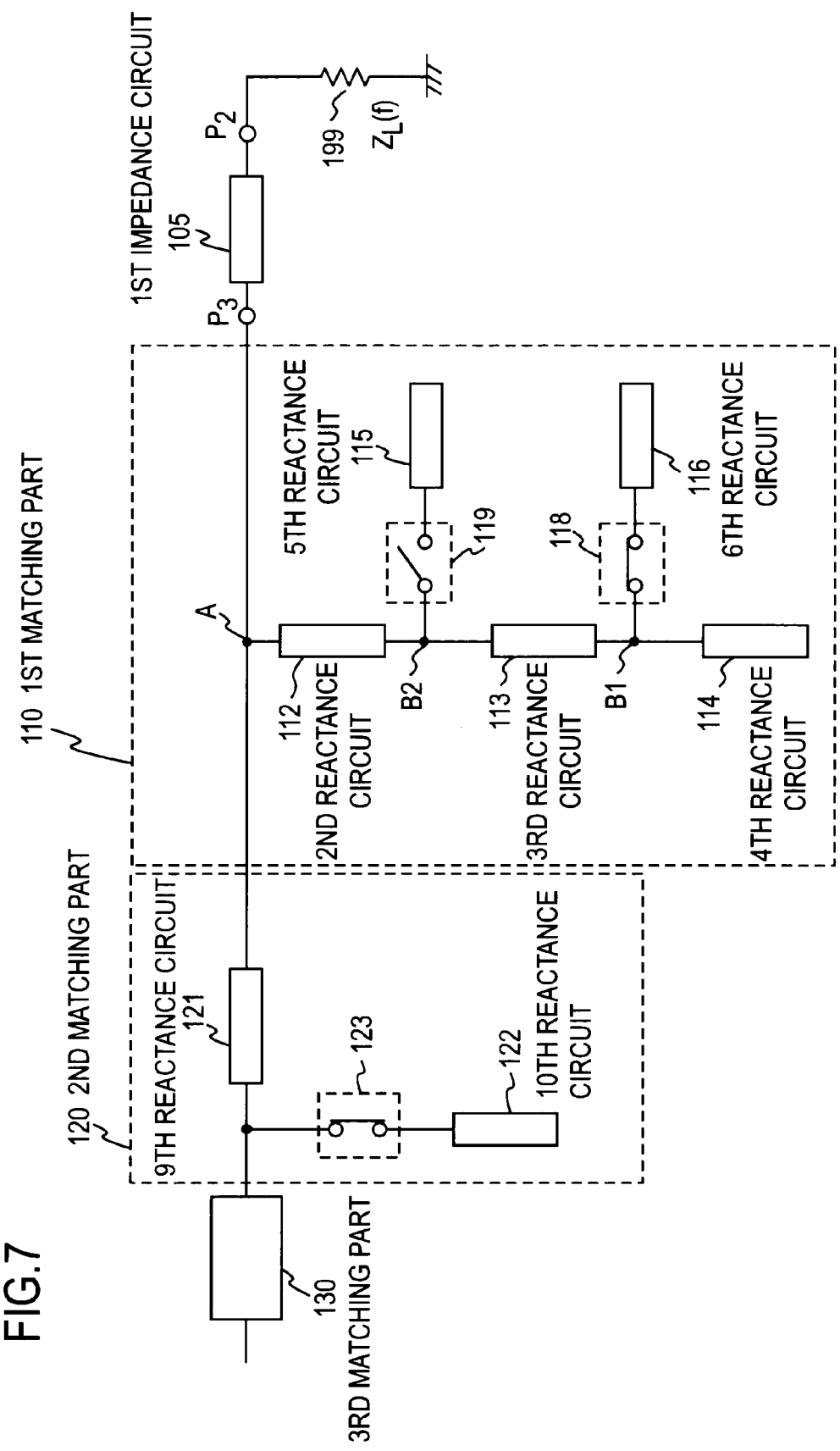
FIG. 7 is circuit diagram showing an operational state of the matching circuit 100 in the frequency band with center frequency $f_1$.

Here, at least the sixth reactance circuit 116, the ninth reactance circuit 121, and the tenth reactance circuit 122 shown in FIG. 7 can be configured exclusively for impedance matching in the frequency band with center frequency $f_1$. The π-shaped circuit comprising the sixth reactance circuit 116, the ninth reactance circuit 121, the tenth reactance circuit 122, the second reactance circuit 112, and the third reactance circuit 113 forms a double-stub matching circuit, and there is a designer's discretion with respect to the configurations of the two stubs (the sixth and tenth reactance circuits 116 and 122 in FIG. 7). This represents the expansion of the designer's discretion in configuring the ninth reactance circuit 121. That is, the amount of delay of the delay circuit (corresponding to the ninth reactance circuit 121 in FIG. 7) is uniquely determined by the load $Z_L(f_1)$ in the single-stub matching circuit shown in FIG. 3 whereas in the configuration according to the first embodiment the designer's discretion in configuring the ninth reactance circuit 121 in the frequency band with center frequency $f_1$ is increased because of the addition of the sixth reactance circuit 116 in effect.

Therefore, if the ninth reactance circuit 121 is implemented by a transmission line, for example, the line length of the ninth reactance circuit 121 can be designed shorter than that in a conventional configuration by appropriately configuring the sixth and tenth reactance circuits 116 and 122.

In this case, that is, in the case of the frequency band with center frequency $f_1$, the third switch 133 of the third matching part 130 is in the off state. Therefore, impedance matching in the frequency band with center frequency $f_1$ can be achieved by choosing a circuit having a characteristic impedance equal to the system impedance $Z_0$, for example a transmission line with the characteristic impedance $Z_0$, in the frequency band with center frequency $f_1$ as the seventh reactance circuit 131.

Next, in the frequency band with center frequency $f_2$, the third switch 133 of the third matching part 130 is turned on and the fourth switch 123 of the second matching part 120 is turned off. In the first matching part 110, in this case, the first switch 118 is turned off and the second switch 119 is turned on. The circuit part of the first matching part 110 excluding the sixth reactance circuit 116 (that is, the second, third, fourth, and fifth reactance circuits 112, 113, 114, and 115 of the first matching part 110), the second matching part 120, and the third matching part 130 together perform impedance matching between the impedance $Z(f_2)$ as viewed from port $P_3$ toward the first impedance circuit 105 and the system impedance $Z_0$. The impedance $Z(f_2)$ is the impedance resulting from the operation of the first impedance circuit 105 functioning as an impedance converter on the input/output impedance $Z_L(f_2)$ of the load 199.

Figure 8:
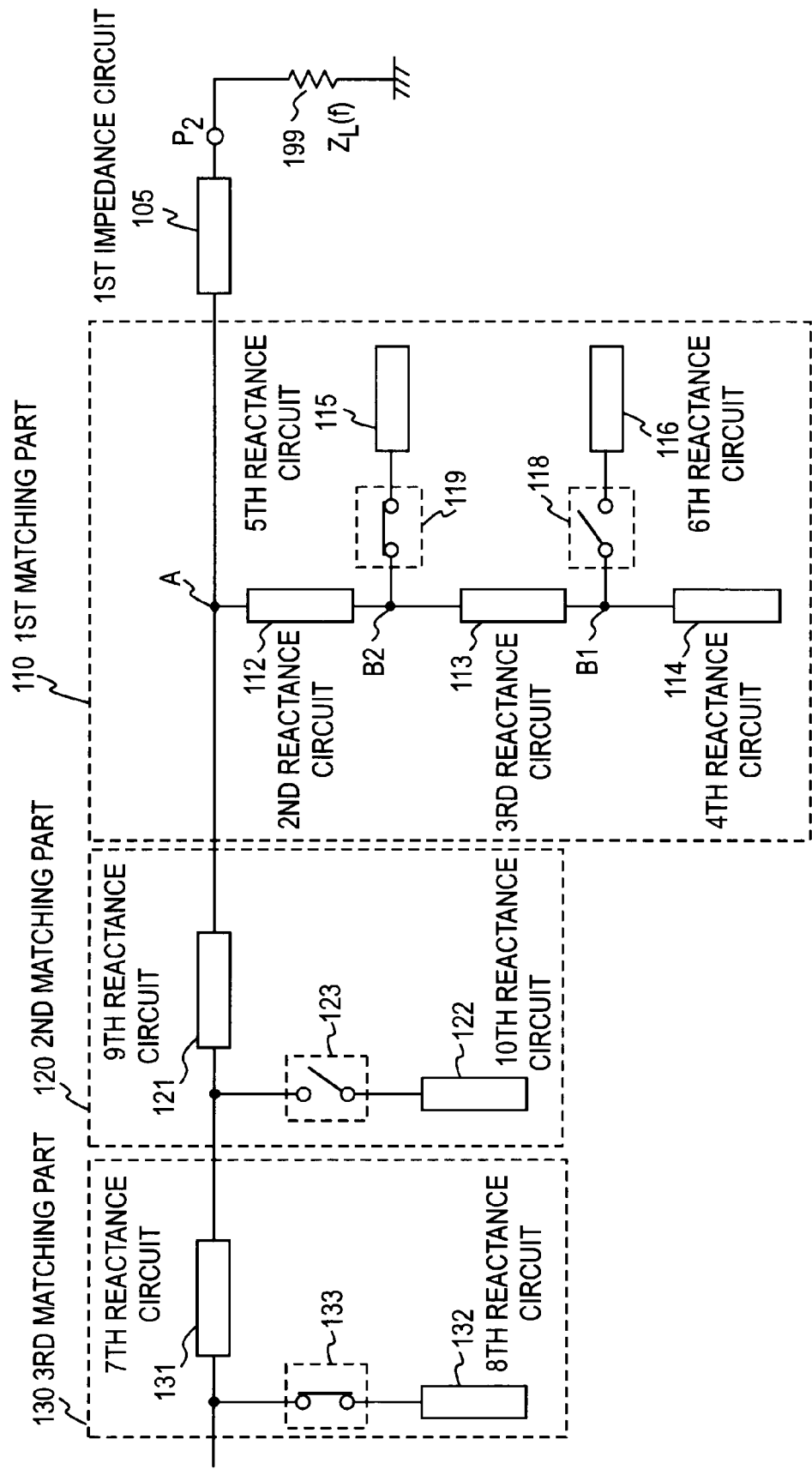
FIG. 8 is a circuit diagram showing an operational state of the matching circuit 100 in the frequency band with center frequency $f_2$.

Here, at least the fifth, seventh and eighth reactance circuits 115, 131, and 132 shown in FIG. 8 can be configured exclusively for impedance matching in the frequency band with center frequency $f_2$. To put it conscientiously, if the seventh reactance circuit 131 is implemented by a transmission line that has a characteristic impedance of $Z_0$ in the frequency band with center frequency $f_1$ as described above, the line length of the transmission line etc. can be designed exclusively for impedance matching in the frequency band with center frequency $f_2$. Here, in the π-shaped circuit comprising the fifth reactance circuit 115, the seventh reactance circuit 131, the eighth reactance circuit 132, the second reactance circuit 112, and the ninth reactance circuit 121, there is a designer's discretion with respect to the configurations of the two stubs (the fifth and eighth reactance circuits 115 and 132 in FIG. 8). This represents the expansion of the designer's discretion in configuring the seventh reactance circuit 131. That is, the designer's discretion in configuring the seventh reactance circuit 131 in the frequency band with center frequency $f_2$ is increased because of the addition of the fifth reactance circuit 115 in effect in the configuration according to the first embodiment.

Therefore, if the seventh reactance circuit 131 is implemented by a transmission line, for example, the line length of the seventh reactance circuit 131 can be designed shorter than that in a conventional configuration by appropriately configuring the fifth and eighth reactance circuits 115 and 132.

As has been described above, the seventh reactance circuit 131 of the third matching part 130 is configured on the basis of the interdependence with the configuration of the first matching part 110 and the configuration of the eighth reactance circuit 132 of the third matching part 130 corresponding to each frequency band.

The matching circuit 100 shown in FIG. 4 is basically the same as the conventional matching circuit 950 shown in FIG. 3 in configuration, except that the first matching part 110 is added. Therefore, a concern arises that the addition of the first matching part 110 increases the matching circuit in size. However, whereas the seventh reactance circuit 131 and the ninth reactance circuit 121 connected in series between ports $P_1$ and $P_2$ need to be designed so that appropriate amounts of delay in each frequency band are provided under the condition that the impedance $Z_0$ is sustained in each of the two or more frequency bands, the first matching part 110 only need to have a particular reactance value in a selected operating frequency band. Since the reactance circuits included in the first matching part 110 has a high degree of flexibility in design, lumped-parameter elements, for example, can be used for the reactance circuits to reduce the size of the reactance circuits. Thus, the addition of the first matching part 110 does not significantly increase the size of the matching circuit.

The insertion loss of the second switch 119 for connecting the fifth reactance circuit 115 and the insertion loss of the first switch 118 for connecting the sixth reactance circuit 116 vary depending on an alternating current flowing through the positions where the switches are inserted. Usually, a standing wave is distributed over circuitry. For example, if the second switch 119 is inserted at a node (a zero displacement point) of AC at a center frequency of $f_2$, the insertion loss of the second switch 119 will be small whereas if the second switch 119 is inserted at an anti-node (a maximum displacement point) of AC, the insertion loss of the second switch 119 will be large. Similarly, if the first switch 118 is inserted at a node of AC at a center frequency of $f_1$, the insertion loss of the first switch 118 will be small, whereas if the first switch 118 is inserted at an anti-node of AC, the insertion loss of the first switch 118 will be large.

In order to minimize the insertion losses of switches, the first switch 118 may be connected to a node of AC at a center frequency of $f_1$ and the second switch 119 may be connected to a node of AC at a center frequency of $f_2$.

As has been described above, the fourth reactance circuit 114 is configured so that the impedance as viewed from connection point B1 toward the fourth reactance circuit 114 in the frequency band with center frequency $f_1$ is sufficiently large (the admittance is approximately 0). From the viewpoint of a signal in the frequency band with center frequency $f_1$, this state is equivalent to a state in which the fourth reactance circuit 114 is not connected in terms of impedance. Therefore, connection point B1 can be designed to be a position of nearly a node of AC at a center frequency of $f_1$ in the state that the sixth reactance circuit 116 is connected to the connection point B1.

Similarly, the third reactance circuit 113 is configured so that the impedance as viewed from connection point B2 toward the third reactance circuit 113 is sufficiently large (the admittance is approximately 0) in the frequency band with center frequency $f_2$. This state, that is, the state in which the first switch 118 is in the off sate, is equivalent to the state where the third and fourth reactance circuits 113 and 114 are not connected in terms of impedance from the viewpoint of a signal in the frequency band with center frequency $f_2$. Therefore, connection point B2 can be designed to be a position of nearly a node of AC at a center frequency of $f_2$ in the state that the fifth reactance circuit 115 is connected to the connection point B2.

In light of the foregoing, the second reactance circuit 112 is preferably configured so as to have reactance values with which the insertion losses of the first and second switches 118 and 119 reduce as much as possible in designing the fifth and sixth reactance circuits 115 and 116 for each frequency band.

Second Embodiment

Figure 9:
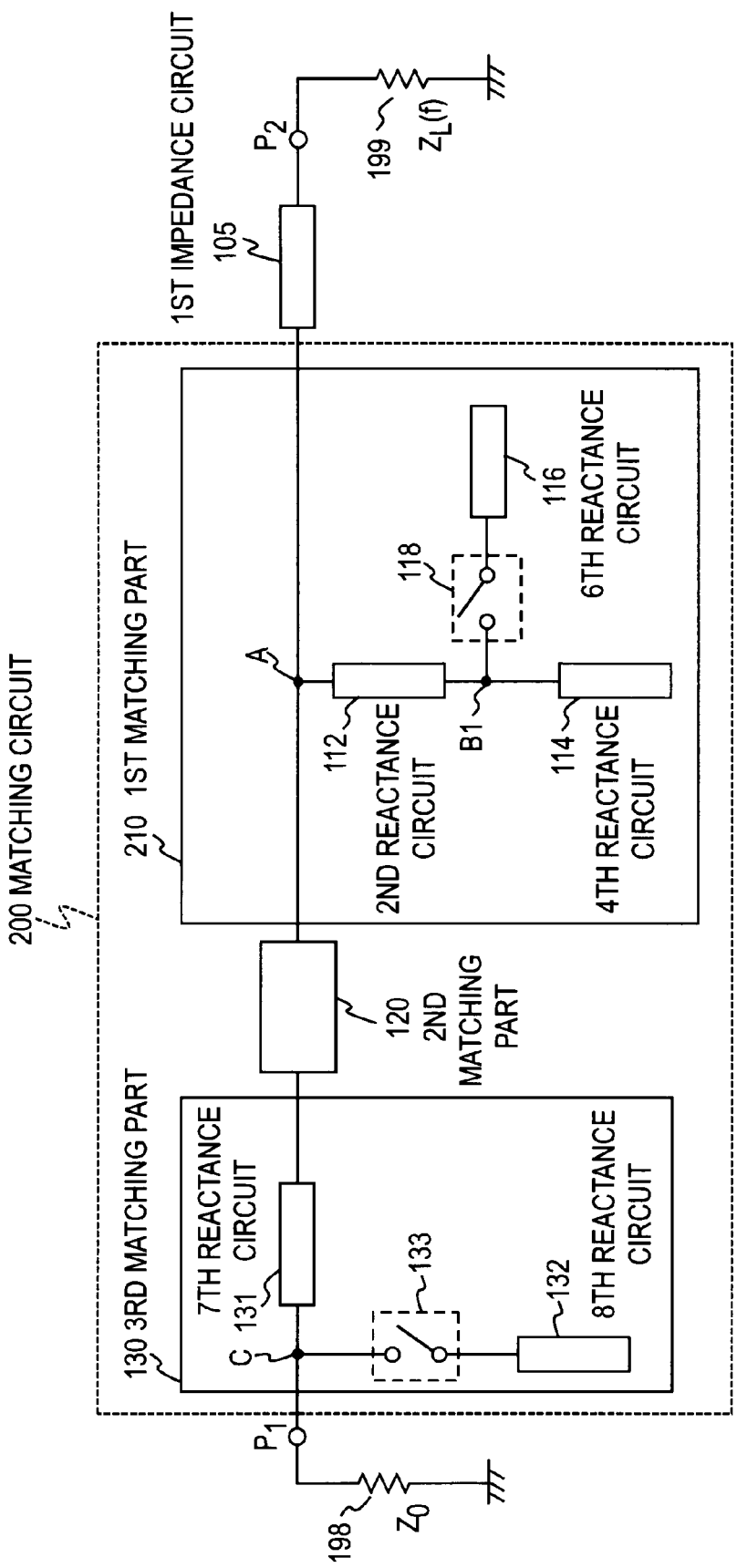
FIG. 9 is a circuit diagram of a matching circuit 200 according to a second embodiment of the present invention.

A matching circuit 200 according to a second embodiment is shown in FIG. 9. Like the matching circuit 100 of the first embodiment, the matching circuit 200 shown in FIG. 9 functions as a matching circuit for each of two frequency bands with center frequencies of $f_1$ and $f_2$ (where $F_1 > f_2$).

In the first embodiment, the fifth and sixth reactance circuits 115 and 116 are provided in the first matching part 110 for each of the two frequency bands. Accordingly, the desired matching circuit 100 can be configured in spite of the fact that the second reactance circuit 112 has reactance values that is obtained by a single element or circuit constituting the second reactance circuit 112 in each frequency band.

On the other hand, in the matching circuit 200 of the second embodiment, the number of components of the first matching part 110 is reduced by designing the second reactance circuit 112 so as to have a predetermined reactance value in a certain frequency band.

For convenience of explanation, it is assumed here that the second reactance circuit 112 has a predetermined reactance value in the frequency band with center frequency $f_2$. A configuration can be implemented that eliminates the need for the fifth reactance circuit 115, the third reactance circuits 113, and the second switch 119 that are components of the matching circuit 100 of the first embodiment. To put it concretely, a first matching part 210 of the matching circuit 200 is configured as follows. One end of the second reactance circuit 112 is connected to the connection point A between the second matching part 120 and the first impedance circuit 105. The other end of the second reactance circuit 112 is connected to one end of the fourth reactance circuit 114 and the sixth reactance circuit 116 is connected to the connection point B1 between the second reactance circuit 112 and the fourth reactance circuit 114 through the first switch 118.

In the configuration, the first switch 118 and the fourth switch 123 are turned on and the third switch 133 is turned off in the frequency band with center frequency $f_1$, and the first switch 118 and the fourth switch 123 are turned off and the third switch 133 is turned on in the frequency band with center frequency $f_2$. The fourth reactance circuit 114 is configured so that the impedance as viewed from the connection point B1 between the fourth reactance circuit 114 and the second reactance circuit 112 toward the fourth reactance circuit 114 is sufficiently large (the admittance is approximately 0) in the frequency band with center frequency $f_1$. For example, the fourth reactance circuit 114 may be an end-short-circuited line having an electrical length of 90 degrees at the center frequency of $f_1$.

Based on the foregoing, the design conditions for the tenth reactance circuit 122, which is a component of the second matching part 120, and the sixth reactance circuit 116, which is a component of the first matching part 210, are determined so that the second matching part 120 and the first matching part 210 practically carry out the function of impedance matching in the frequency band with central frequency $f_1$. For the frequency band with center frequency $f_2$, the design conditions for the eighth reactance circuit 132, which is a component of the third matching part 130, and the second reactance circuit 112, which is a component of the first matching part 210, are determined so that the third matching part 130 and the first matching part 210 practically carry out the function of impedance matching. Therefore, the tenth reactance circuit 122, the eighth reactance circuit 132, the second reactance circuit 112, and the sixth reactance circuit 116 can be configured so that the design conditions are satisfied. Like the matching circuit 100 according to the first embodiment, the matching circuit 200 according to the second embodiment thus configured is capable of accomplishing impedance matching in each of the frequency bands with center frequencies $f_1$ and $f_2$.

If a ninth reactance circuit 121 is implemented by a transmission line, a configuration is chosen from design conditions for the sixth reactance circuit 116 that minimizes the line length of the ninth reactance circuit 121. If a seventh reactance circuit 131 is implemented by a transmission line, a configuration is chosen from the design conditions for the second reactance circuit 112 that minimizes the line length of the seventh reactance circuit 131. With these configurations, the total line length of the ninth and seventh reactance circuits 121 and 131 can be reduced and therefore a matching circuit reduced in size can be implemented.

Third Embodiment

Figure 10:
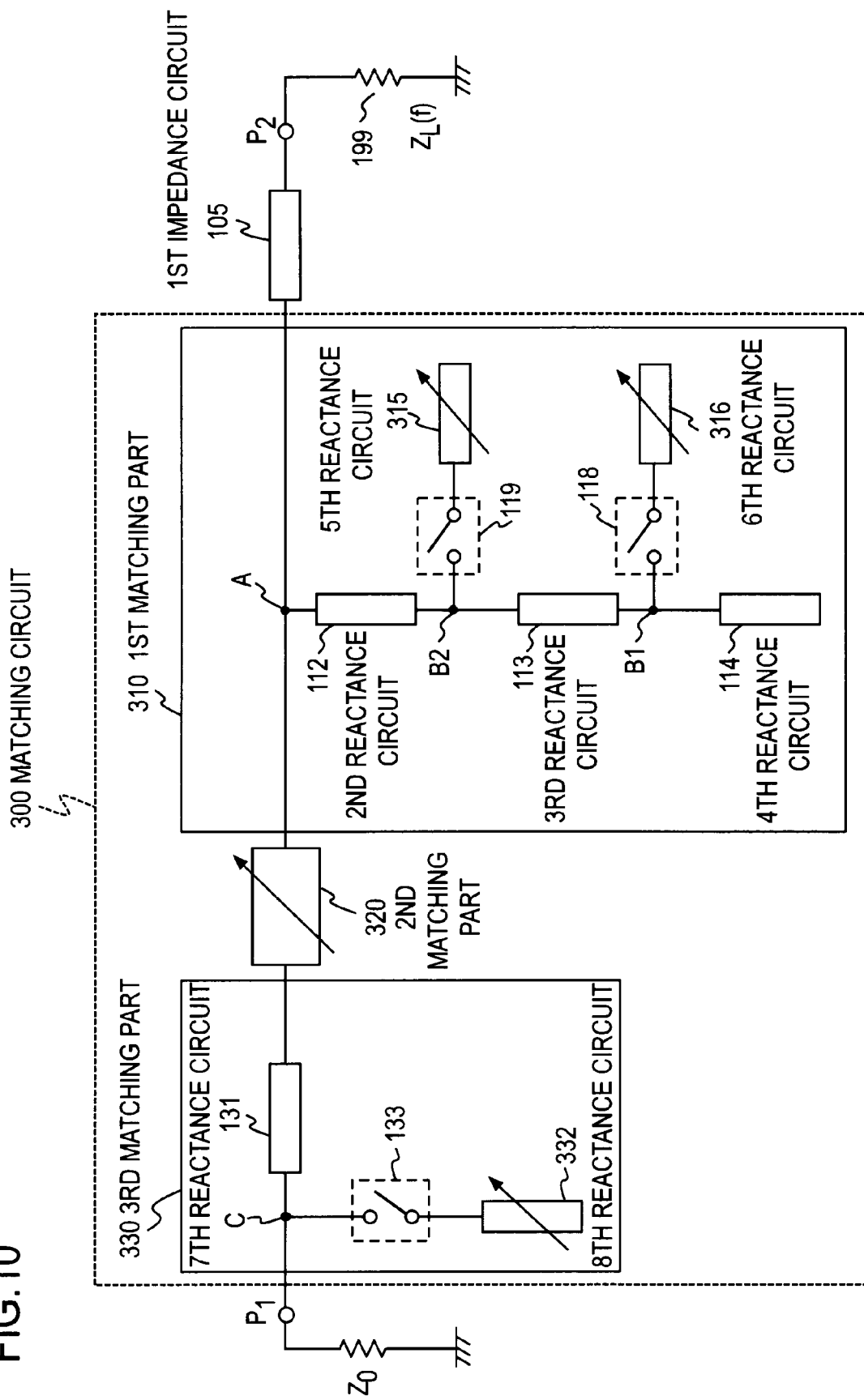
FIG. 10 is a circuit diagram of a matching circuit 300 according to a third embodiment of the present invention.

Matching circuits that accomplish impedance matching for each of two frequency bands have been shown in the first and second embodiments. In a third embodiment, a matching circuit that accomplishes impedance matching for each of more than two frequency bands will be shown. FIG. 10 shows a matching circuit 300 according to the third embodiment. The matching circuit 300 according to the third embodiment has a configuration similar to that of the matching circuit 100 of the first embodiment. Therefore, the matching circuit 300 will be described in comparison to the matching circuit 100.

A first matching part 310 of the matching circuit 300 has a configuration in which the fifth and sixth reactance circuits 115 and 116 of the matching circuit 100 are replaced with a fifth and sixth reactance circuits 315 and 316 that are variable reactance circuits whose reactance values can be changed among q kinds of values (where q is an integer greater than or equal to 2). The variable reactance circuit may be a variable capacitor whose capacitance can be changed or a variable inductor whose inductance can be changed, for example. A second matching part 320 of the matching circuit 300 has a configuration that allows its impedance to be changed among q kinds of impedances. Such a configuration of the second matching part 320 may be for example the same configuration as that of the second matching part 120 described with respect to the first embodiment except that the tenth reactance circuit 122 is replaced with a tenth reactance circuit that is a variable reactance circuit. The variable reactance circuit may also be a variable capacitor, a variable inductor or the like, for example. A third matching part 330 of the matching circuit 300 includes an eighth reactance circuit 332 whose reactance can be changed among q kinds of reactance values, in place of the eighth reactance circuit 132 of the matching circuit 100.

In the matching circuit 300 having the configuration described above, the reactance circuits or the second matching part provides q kinds of reactance or impedance values, and switching can be made between the two circuit configurations by switches in a manner similar to that in the first embodiment. Consequently, impedance matching in up to 2*q frequency bands can be achieved.

Since the fifth reactance circuit 315, the sixth reactance circuit 316, and the eighth reactance circuit 332 are variable reactance circuits and the second matching part 320 is configured so as to be capable of changing impedances, the seventh reactance circuit 131 can be configured without restriction by load $Z_L(f)$. Therefore, if the seventh reactance circuit 131 is implemented by a transmission line, the seventh reactance circuit 131 can be designed to have a minimized line length. For example, the seventh reactance circuit 131 may be designed to have the shortest possible line length at an appropriate one of q frequency bands that are available when the first switch 118 is turned on.

Fourth Embodiment

Figure 11:
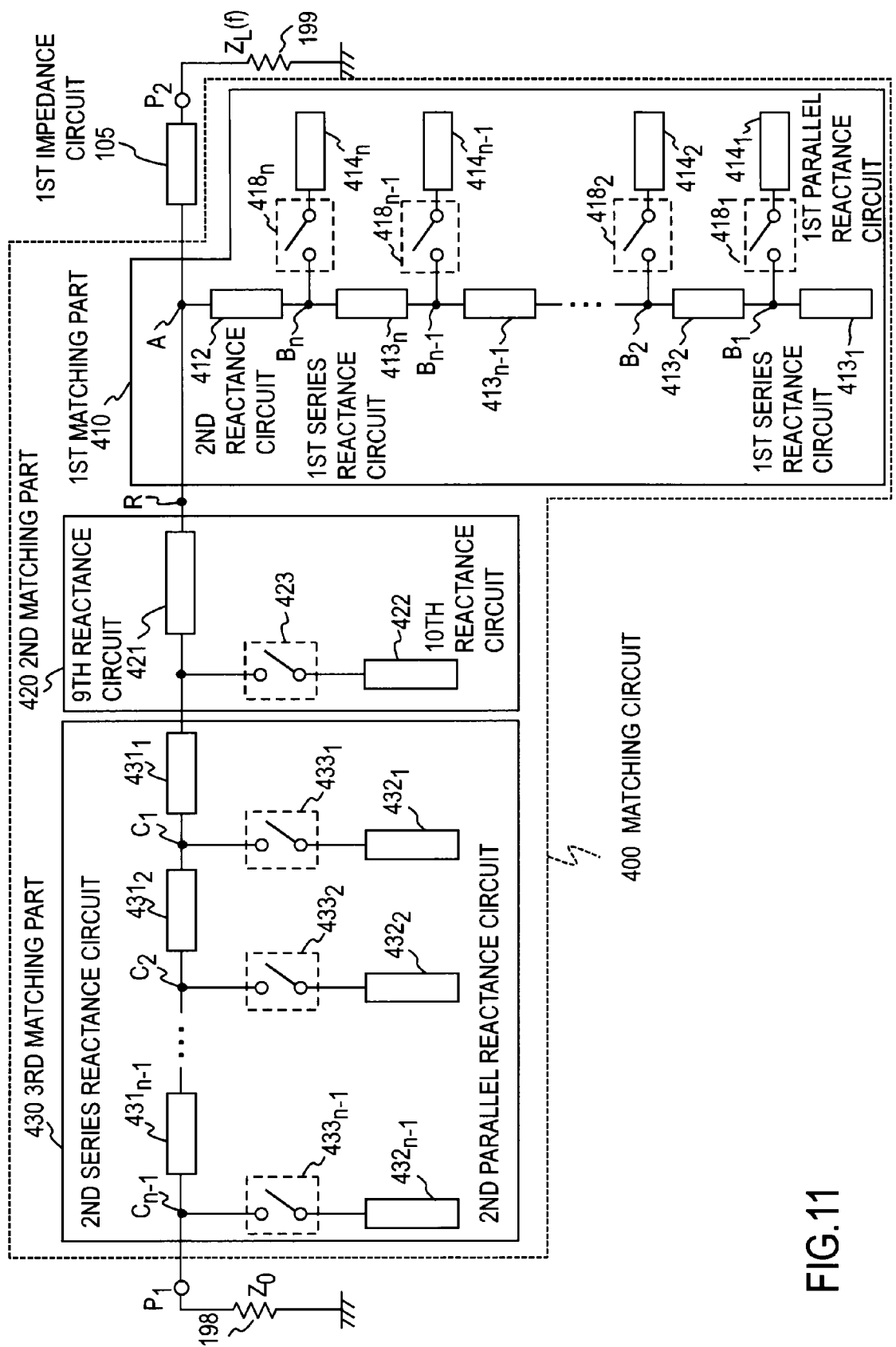
FIG. 11 is a circuit diagram of a matching circuit 400 according to a fourth embodiment of the present invention.
Figure 12:
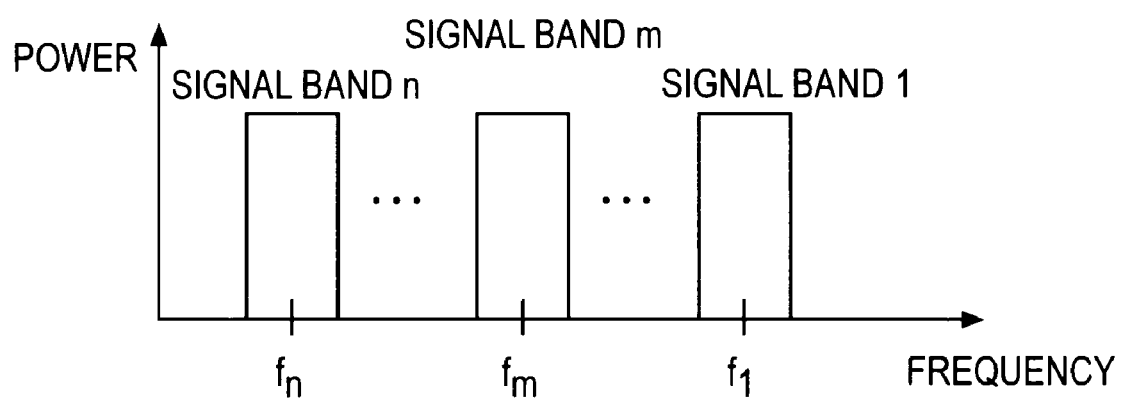
FIG. 12 is a conceptual diagram showing n frequency bands with center frequencies $f_1, \ldots, f_n$.

In a fourth embodiment, a matching circuit which accomplishes impedance matching for each of more frequency bands with a configuration different than that in the third embodiment will be described. A matching circuit 400 according to the fourth embodiment is shown in FIG. 11. The matching circuit 400 is an extended version of the matching circuit 100 of the first embodiment and implements impedance matching in each of n frequency bands with center frequencies of $f_1, f_2, \ldots, f_n$ ($f_1 > f_2 > \ldots > f_n$) shown in FIG. 12. Here, n is an integer greater than or equal to 3. If n is 2, the embodiment is equivalent to the first embodiment.

A first matching part 410 in the matching circuit 400 includes a second reactance circuit 412 and n first series reactance circuits 413$_1$ to 413$_n$, which are connected in series.

To put it concretely, one end of the second reactance circuit 412 is connected to the connection point A between a second matching part 420 and the first impedance circuit 105. The other end of the second reactance circuit 412 is connected to the first series reactance circuit 413$_n$. The other end of the first series reactance circuit 413$_n$ (the end to which the second reactance circuit 412 is not connected) is connected to one end of the first series reactance circuit 413$_{n-1}$. The other end of the first series reactance circuit 413$_{n-1}$ (the end to which first series reactance circuit 413$_n$ is not connected) is connected to one end of the first series reactance circuit 413$_{n-2}$. Such connection is repeated to form a series connection so that the other end of the first series reactance circuit 413$_2$ (the end to which the first series reactance circuit 413$_3$ is not connected) is connected to one end of the first series reactance circuit 413$_1$.

A first parallel reactance circuit 414$_n$ is connected to the connection point B$_n$ between the second reactance circuit 412 and the first series reactance circuit 413$_n$ through a first switch 418$_n$. A first parallel reactance circuit 414$_{n-1}$ is connected to the connection point B$_{n-1}$ between the first series reactance circuit 413$_n$ and the first series reactance circuit 413$_{n-1}$ through a first switch 418$n-1$. In this way, the first parallel reactance circuit 414$_x$ is connected to the connection point B$_x$ between the first series reactance circuit 413$_{x+1}$ and the first series reactance circuit 413$_x$ through the first switch 418$_x$, where x=n−2, n−3, ..., 1. It is not intended here that the n first series reactance circuits 413$_1$ to 413$_n$ should be implemented as circuits of the same type. For example, some of the n first series reactance circuits 413$_1$ to 413$_n$ may be implemented by transmission lines and the others may be implemented by lumped-parameter elements, as appropriate. The same applies to the n first parallel reactance circuits 414$_1$ to 414$_n$.

With this configuration, at least n reactance values can be set by turning on one of the first switches 418$_1$ to 418$_n$ in the first matching part 410. For example, only the first switch 418$_m$ is turned on for the frequency band with the m-th center frequency $f_m$, where m is an integer greater than or equal to 1. The connection point B$_m$ at which the first switch 418$_m$ is connected is located in a position where the impedance as viewed from the position toward the first series reactance circuits 413$_1$ to 413$_m$ is sufficiently large (the admittance is approximately 0) in the frequency band with the m-th center frequency $f_m$. For example, the first series reactance circuit 413$_1$ may be an end-shorted line with a line length of $\lambda_1/4$ and the line length of the first series reactance circuit 413$_m$ may be chosen such that the sum of the line lengths of the first series reactance circuits 413$_1$ to 413$_m$ is $\lambda_m/4$. The wavelength $\lambda_m$ corresponds to the m-th center frequency $f_m$. Here, the connection point B$_m$ can be designed preferably to be a position of nearly a node of AC at the m-th center frequency $f_m$ in the state that the m-th reactance 414$_m$ circuit is connected to the connection point B$_m$ in view of minimizing the insertion loss of the first switch 418$_m$.

The second matching part 420 is a circuit that matches the impedance as viewed from the connection point R between the second matching part 420 and the first matching part 410 toward the first matching part 410 to the system impedance $Z_0$ in the frequency band with the first center frequency $f_1$. Such a second matching part 420 may have the configuration shown in FIG. 6. Here, a fourth switch 423 is turned on for the frequency band with the first center frequency $f_1$ and turned off for the frequency band with the m-th center frequency $f_m$ (m≠1).

A third matching part 430 in the matching circuit 400 includes n−1 second series reactance circuits 431$_1$ to 431$_{n-1}$ connected in series.

To put it concretely, one end of the second series reactance circuit 431$_1$ is connected to the other end of the second matching part 420 (the end opposite to the end to which the first impedance circuit 105 is connected). The other end of the second series reactance circuit 431$_1$ is connected to the second series reactance circuit 431$_2$. The other end of the second series reactance circuit 431$_2$ (the end to which the second series reactance circuit 431$_1$ is not connected) is connected to one end of the second series reactance circuit 431$_3$. The other end of the second series reactance circuit 431$_3$ (the end to which the second series reactance circuit 431$_2$ is not connected) is connected to one end of the second series reactance circuit 413$_4$. Such connection is repeated to form a series connection so that the other end of the second series reactance circuit 431$_{n-2}$ (the end to which the second series reactance circuit 431$_{n-3}$ is not connected) is connected to one end of the second series reactance circuit 431$_{n-1}$. The other end of the second series reactance circuit 431$_{n-1}$ is connected to port P$_1$.

A second parallel reactance circuit 432$_1$ is connected to the connection point C$_1$ between the series reactance circuit 431$_1$ and the second series reactance circuit 431$_2$ though a second switch 433$_1$. A second parallel reactance circuit 432$_2$ is connected to the connection pint C$_2$ between the second series reactance circuit 431$_2$ and the second series reactance circuit 431$_3$ through a second switch 433$_2$. In this way, the second parallel reactance circuit 432$_y$ is connected to the connection point C$_y$ between the series reactance circuit 431$_y$ and the second series reactance circuit 431$_{y+1}$ through the second switch 433$_y$, where y=3, 4, ..., n−2. The second parallel reactance circuit 432$_{n-1}$ is connected to the connection point C$_{n-1}$ between the series reactance circuit 431$_{n-1}$ and port P$_1$ through the second switch 433$_{n-1}$.

It is not intended here that the n−1 second parallel reactance circuits 432$_1$ to 432$_{n-1}$ should be implemented as circuits of the same type. For example, some of the n−1 second parallel reactance circuits 432$_1$ to 432$_{n-1}$ may be implemented by transmission lines and the other may be implemented by lumped-parameter elements, as appropriate. The n−1 second series reactance circuits 431$_1$ to 431$_{n-1}$ need to be designed so that a characteristic impedance of $Z_0$ is provided in each of the two or more frequency bands in order to match to the system impedance $Z_0$ and an appropriate amount of delay for each frequency band needs to be designed. These can be achieved simply by implementing all of the second series reactance circuits by transmission lines with characteristic impedance $Z_0$ and by adjusting the amounts of delay. However, it is not intended to prohibit the n−1 second series reactance circuits 431$_1$ to 431$_{n-1}$ from being implemented by circuits equivalent to transmission lines with characteristic impedance $Z_0$.

The switches in the matching circuit 400 are turned on and off according to each frequency band as follows.

For the frequency band with the first center frequency $f_1$, only the first switch 418$_1$ is turned on in the first matching part 410, the fourth switch 423 in the second matching part 420 is turned on, and all of the second switches in the third matching part 430 are turned off.

For the frequency band with the m-th center frequency $f_m$ (where m≧2), only the first switch 418$_m$ is turned on in the first matching part 410, the fourth switch 423 is turned off in the second matching part 420, and only the second switch 433$_{m-1}$ is turned on in the third matching part 430.

In the matching circuit 400, the first parallel reactance circuit 414$_1$, the ninth reactance circuit 421, and the tenth reactance circuit 422 can be configured exclusively for impedance matching in the frequency band with the first center frequency f$_1$. There is a designer's discretion with respect to the configurations of the first parallel reactance circuit 414$_1$ and the tenth reactance circuit 422. This represents the expansion of the designer's discretion in configuring the ninth reactance circuit 421, as in the first embodiment.

In the matching circuit 400, the first parallel reactance circuit 414$_{m-1}$, the second series reactance circuit 431$_m$, and the second parallel reactance circuit 432$_{m-1}$ can be configured exclusively for impedance matching in the frequency band with the m-th center frequency f$_m$. Because there is a designer's discretion with respect to the configurations of the first parallel reactance circuit 414$_m$ and the second parallel reactance circuit 432$_{m-1}$, the designer's discretion is expanded in configuring the second series reactance circuit 431$_{m-1}$.

Therefore, if the ninth reactance circuit 421 and the n−1 second series reactance circuits 431$_1$ to 431$_{n-1}$ are implemented by transmission lines, the line lengths of the ninth reactance circuit 421 and the second series reactance circuits 431$_1$ to 431$_{n-1}$ can be further reduced by appropriately configuring the tenth reactance circuit 422, the first parallel reactance circuits 414$_1$ to 414$_n$, and the second parallel reactance circuits 432$_1$ to 432$_{n-1}$.

Variation of the Fourth Embodiment

As in the second embodiment, the number of components of the first matching part 410 in the matching circuit 400 can be reduced by designing the second reactance circuit 112 so as to take a predetermined reactance value at a certain particular frequency.

Figure 13:
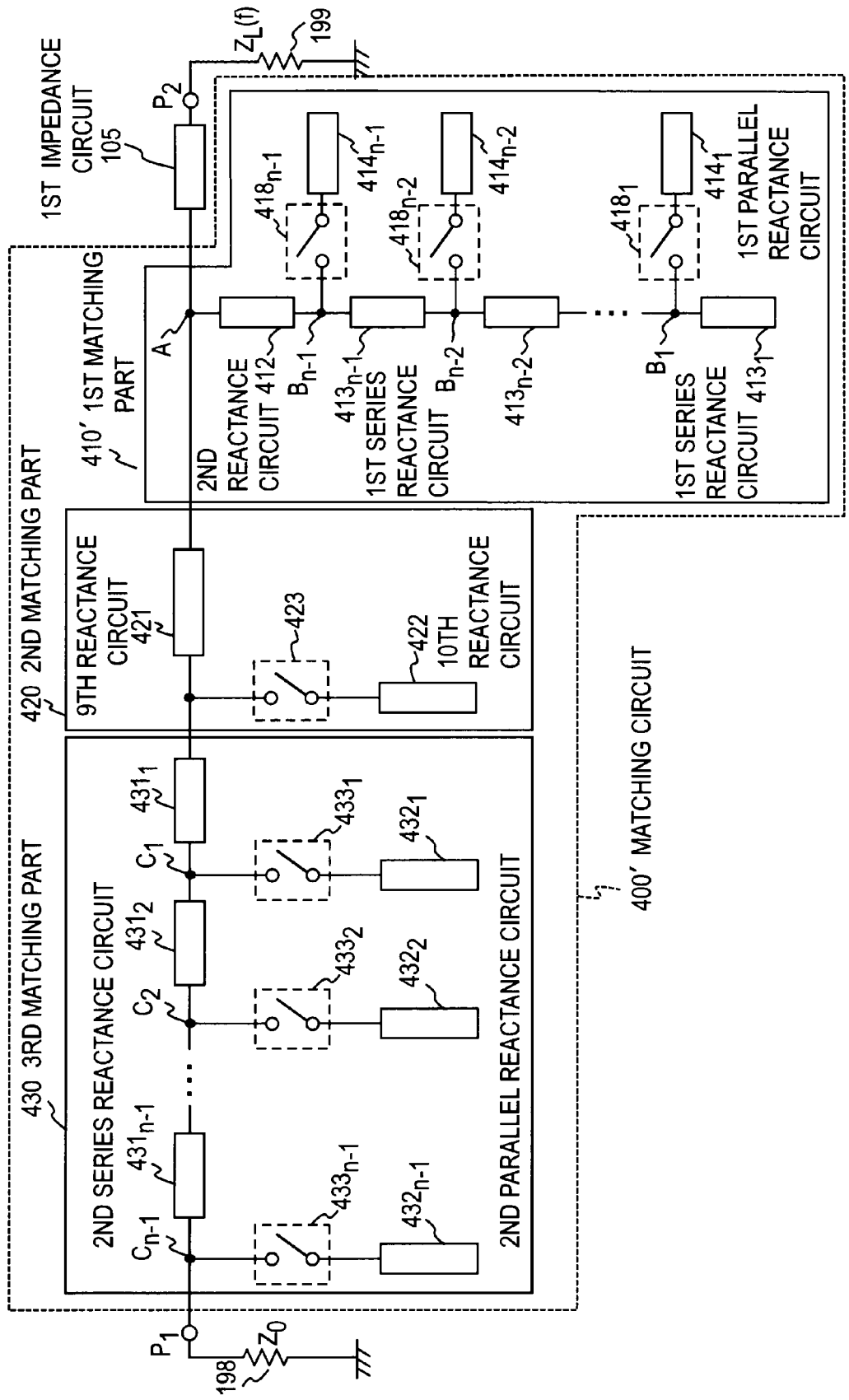
FIG. 13 is a circuit diagram of a matching circuit 400' according to a variation of the fourth embodiment of the present invention.

That is, if the second reactance circuit 412 is designed to take a predetermined reactance value in the frequency band with the n-th center frequency f$_n$, the first series reactance circuits 413$_n$, the first parallel reactance circuits 414$_n$, and the first switches 418$_n$, which are the components of the first matching part 410 in the matching circuit 400, can be omitted from the matching circuit 400 in the fourth embodiment (see FIG. 13).

In this configuration, only the first switch 418$_1$ and the fourth switch 423 are turned on and all of the second switches are turned off for the frequency band with the first center frequency f$_1$. For the frequency band with the m-th center frequency f$_m$, where 2≦m≦n−1, only the first switch 418$_m$ and the second switch 433$_{m-1}$ are turned on and the fourth switch 423 is turned off. For the frequency band with the n-th center frequency f$_n$, only the second switch 433$_{n-1}$ is turned on and the fourth switch 423 and all the first switches are turned off.

Based on the foregoing, the design conditions for the tenth reactance circuit 422, which is a component of the second matching part 420, and the first parallel reactance circuit 414$_1$, which is a component of the first matching part 410, are determined so that the second matching part 420 and the first matching part 410 practically carry out the function of impedance matching in the frequency band with central frequency f$_1$. For the frequency band with the m-th center frequency f$_m$, where 2≦m≦n−1, the design conditions for the second parallel reactance circuit 432$_{m-1}$ which is a component of the third matching part 430 and the first parallel reactance circuit 414$_m$ which is a component of the first matching part 410 are determined so that the third matching part 430 and the first matching part 410 practically carry out the function of matching impedances. For the frequency band with the n-th center frequency band f$_n$, the design conditions for the second parallel reactance circuit 432$_{n-1}$, which is a component of the third matching part 430, and the second reactance circuit 412, which is a component of the first matching part 410, are determined so that the third matching part 430 and the first matching part 410 practically carry out the function of impedance matching. The second reactance circuit 412 and the first parallel reactance circuits 414$_1$ to 414$_{n-1}$ can be configured in accordance with these design conditions. With the configuration, the matching circuit 400' which is a variation of the fourth embodiment can implement impedance matching in each of the frequency bands with center frequencies of f$_1$ to f$_n$, like the matching circuit 400 of the fourth embodiment.

Fifth Embodiment

Figure 14:
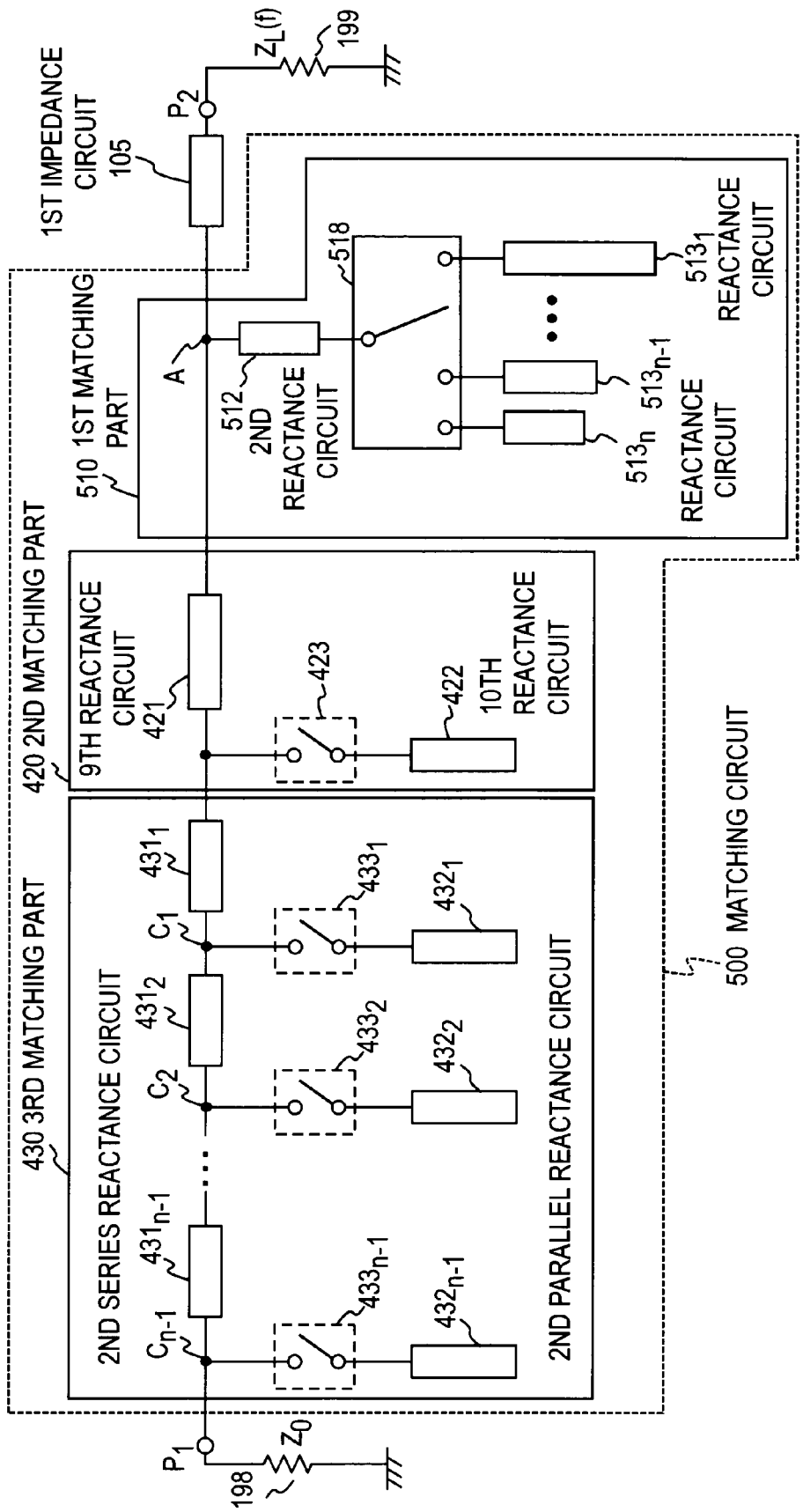
FIG. 14 is a circuit diagram of a matching circuit 500 according to a fifth embodiment of the present invention.

Referring to FIG. 14, a matching circuit 500 according to a fifth embodiment will be described.

As has been described with respect to the embodiments given above, the first matching part may have any configuration that can provide a predetermined reactance value in accordance with each frequency band for which impedance matching is to be performed. The matching circuit 500 includes a first matching part 510 configured to use a single-pole n-throw switch 518 to select one of n reactance circuits 513$_1$ to 513$_n$ to provide a predetermined reactance value according to each frequency band for which impedance matching is to be performed. Only the differences of the matching circuit 500 from the matching circuit 400 will be described below based on the configuration of the matching circuit 400 according to the fourth embodiment.

The first matching part 510 of the matching circuit 500 includes a second reactance circuit 512, a single-pole n-throw switch 518, and n reactance circuits 513$_1$ to 513$_n$. One end of the second reactance circuit 512 is connected to connection point A, the other end of the second reactance circuit 512 is connected to the input terminal of the single-pole n-throw switch 518, and the reactance circuits 513$_1$ to 513$_n$ are connected to the output terminals of the single-pole n-throw switch 518. It is not intended that the n reactance circuits 513$_1$ to 513$_n$ should be implemented as circuits of the same type. For example, some of the n reactance circuits 513$_1$ to 513$_n$ may be implemented by transmission lines and the others by lumped-parameter elements, for example, as appropriate.

The first matching part 510 selects one of the reactance circuits 513$_1$ to 513$_n$ using the single-pole n-throw switch 518 in response to any of second switches 433$_1$ to 433$_{n-1}$ and a fourth switch 423 being turned on. A predetermined reactance value can be provided by the reactance circuit thus selected and the second reactance circuit 512.

Further Notes on the Second Matching Parts of the Embodiments

One exemplary configuration of the second matching part shown in FIG. 6 has been described in the embodiments given above. The configuration of the second matching part is not limited to the one shown in FIG. 6. For example, the ninth reactance circuit may be connected in series between the first and third matching parts and the tenth reactance circuit may be connected to the connection point between the ninth reactance circuit and the third matching part without using the fourth switch. That is, a configuration is possible that is equivalent to the one shown in FIG. 6 in which the fourth switch is always in the on state. This is because the second matching part in the configuration in which the reactance circuits in the first matching part and the reactance circuits in the third matching part form a π-shaped circuit is no more than a circuit that has a constant reactance value as apparent from the description of the embodiments given above and therefore turning off the fourth switch is not an essential technical requirement. In any case, the second matching part can flexibly be configured as an impedance converter.

Exemplary Applications

Figure 15:
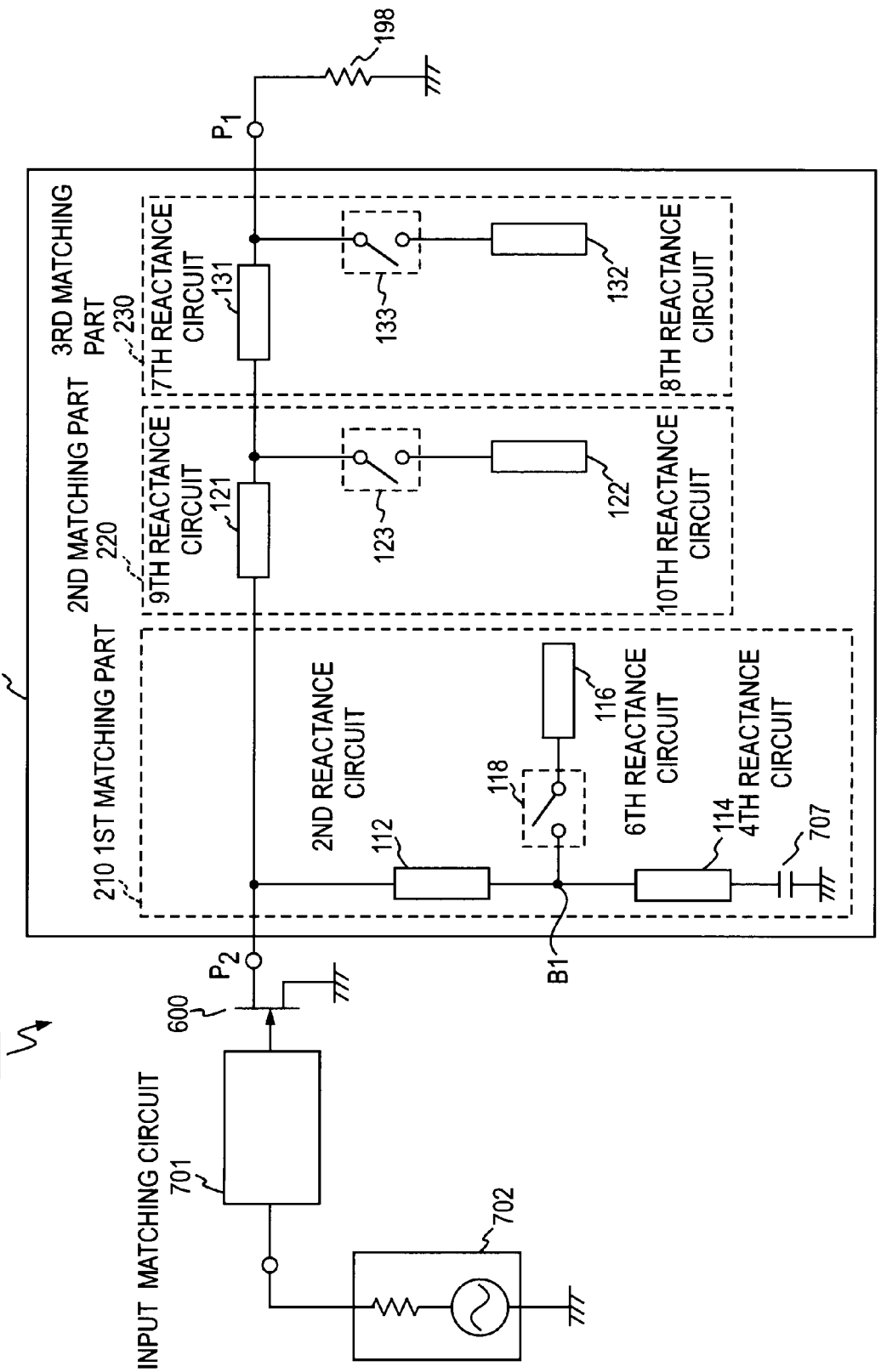
FIG. 15 is a circuit diagram of a multiband amplifier 700 using the matching circuit 200 according to the second embodiment as an output matching circuit for an amplification device 600.

By using a matching circuit according to any of the embodiments of the present invention as an input/output matching circuit for an amplification device 600, for example, a multiband amplifier can be implemented. FIG. 15 shows a multiband amplifier 700 in which the matching circuit 200 according to the second embodiment is used as an output matching circuit for an amplification device 600. The multiband amplifier 700 shown in FIG. 15 is designed to operate in each of the frequency bands with frequencies of $f_1=5$ GHz and $f_2=3$ GHz and second, fourth, sixth, seventh, eighth, ninth, and tenth reactance circuits are all implemented by transmission lines with a characteristic impedance of $Z_0=50\Omega$. The system impedance is also $Z_0 50\Omega$. Examples of the amplification device 600 include a transistor, FET (Field-Effect Transistor), MOSFET (Metal Oxide Semiconductor FET), and TFT (Thin Film Transistor). While n-channel junction FETs are shown as amplification devices in the drawings, it is not intended to limit amplification devices to n-channel junction FETs but they are shown illustrative only.

The line length of each transmission line is determined by calculation using a microstrip line on a 0.785-thick substrate with a relative permittivity of 2.2 as an example. While details of the input matching circuit 701 is not shown, the input matching circuit 701 may be the one described with respect to the first or second embodiments of the present invention or may be a broadband matching circuit capable of achieving impedance matching in the range from frequency $f_1$ to $f_2$. Alternatively, the input matching circuit 701 may be implemented by a multiband matching circuit disclosed in reference literature (Atsushi Fukuda, Hiroshi Okazaki, and Shoichi Narahashi, "Power Amplifier for Broadband Applications Beyond the Third Generation—Multi-band, High-efficiency Power Amplifier using MEMS switches for Mobile Terminals—", NTT DoCoMo Technical Journal Vol. 8, No. 3, pp. 24-31, October 2006). One end of the input matching circuit 701 is connected to the FET 600 and the other end is connected to a signal source 702 with a signal source impedance of 50Ω.

In the multiband amplifier 700, the first and fourth switches 118 and 123 are turned on in the frequency band with central frequency $f_1$. Here, the fourth reactance circuit 114 in the first matching part 210 is implemented by a transmission line with a physical length of 11 mm, one end (the end to which the second reactance circuit 112 is not connected) of which is short-circuited by a capacitor 707 with a capacitance of 100 pF, for example. The physical length is equivalent to an electrical length of approximately 90 degrees at center frequency $f_1$ and therefore the impedance as viewed from the connection point B1 between the second reactance circuit 112 and the fourth reactance circuit 114 toward the fourth reactance circuit 114 is sufficiently large (the admittance is approximately 0).

Here, impedance matching in the frequency band with center frequency of $f_1$ can be established by implementing the sixth, ninth, and tenth reactance circuits 116, 121, and 122 by transmission lines having lengths of 3 mm, 13 mm, and 17 mm, respectively. The seventh reactance circuit 131 is a transmission line with a characteristic impedance of $Z_0$ and therefore the physical length does not cause impedance mismatch in the frequency band with center frequency $f_1$. When designing the sixth reactance circuit 116, the second reactance circuit 112 must be considered. Therefore, the sum of the reactance values of the second and sixth reactance circuits 112 and 116 is designed in design for the frequency band with center frequency $f_1$, and then the physical length of the sixth reactance circuit 116 is determined with considering the physical length of the second reactance circuit 112 obtained by impedance matching in the frequency band with center frequency $f_2$, which will be described later.

In the multiband amplifier 700, the first switch 118 is turned off, the third switch 133 is turned on, and the fourth switch 123 is turned off in the frequency band with center frequency $f_2$. Here, impedance matching in the frequency band with center frequency $f_2$ can be established by implementing the second reactance circuit, seventh reactance circuit, and eighth reactance circuit 112, 131, and 132 by transmission lines with lengths of 3 mm, 12 mm, and 28 mm, respectively.

While the second, fourth, sixth, eighth, and tenth reactance circuits 112, 114, 116, 132, and 122 are implemented by transmission lines in the example described above, these reactance circuits can be implemented by lumped-parameter elements as mentioned above to reduce them in size because lumped-parameter elements can be designed so as to satisfy design requirements in one fixed frequency band with center frequency $f_1$ or $f_2$. On the other hand, it is simpler to implement the seventh and ninth reactance circuits 131 and 121 by transmission lines because of the reasons described above. In the example described above, the sum of the line lengths of the seventh and ninth reactance circuits 131 and 121 is 25 mm.

Figure 16:
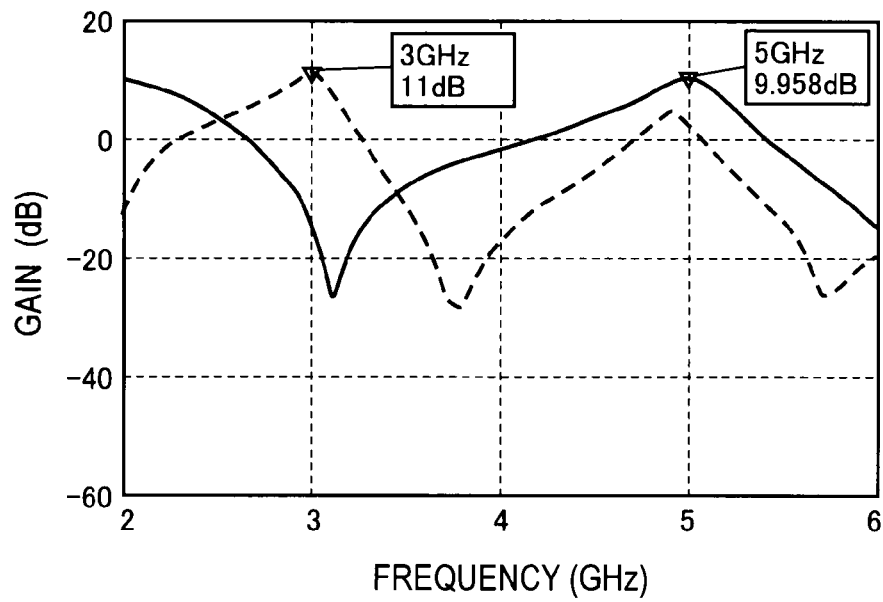
FIG. 16 shows a frequency characteristic in the gain of the multiband amplifier 700.

FIG. 16 shows the gain-frequency response of the multiband amplifier 700 shown in FIG. 15. In this simulation, calculation is performed on the assumption that the first, second and third switches are ideal switches whose losses are zero in the on state and whose isolation is infinite in the off state. While the simulation will be described in which such ideal switches are used, amplitude-frequency response and phase-frequency response of the switches, like other components, should also be considered in real design.

Figure 17:
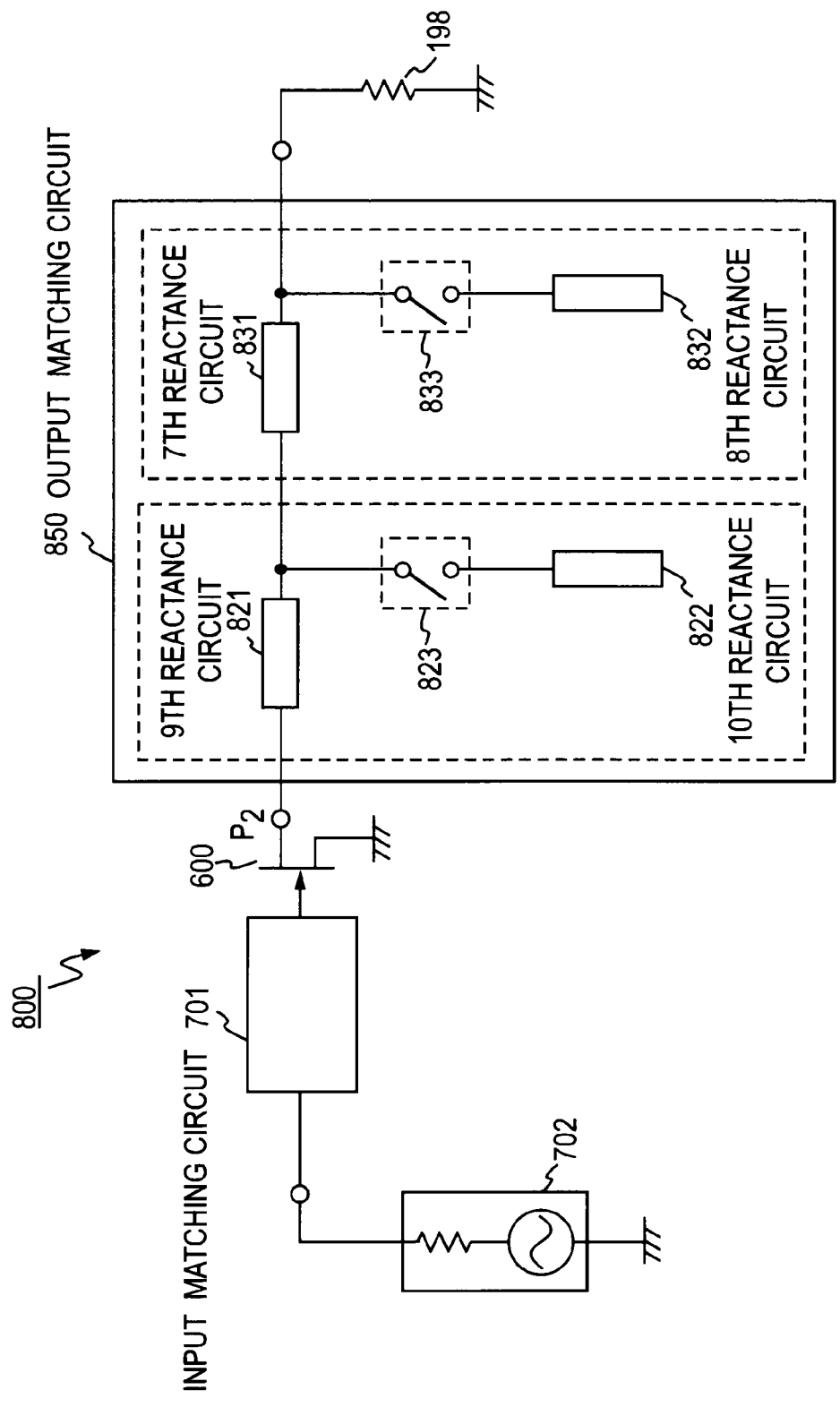
FIG. 17 is a circuit diagram of a multiband amplifier 800 using a conventional matching circuit 850 as an output matching circuit for an amplification device 600.

FIG. 17 shows as a comparative example a multiband amplifier 800 configured with an input matching circuit 701 used in the multiband amplifier 700 shown in FIG. 15 and an output matching circuit 850 with a conventional configuration in which the first matching part 210 is not added. Like the multiband amplifier 700 shown in FIG. 15, the multiband amplifier 800 shown in FIG. 17 is designed to operate in each of the frequency bands of $f_1=5$ GHz and $f_2=3$ GHz and the seventh, eighth, ninth, and tenth reactance circuits 831,832, 821, and 822 are all implemented by transmission lines with a characteristic impedance of $Z_0=50\Omega$.

In the multiband amplifier 800 shown in FIG. 17, a fourth switch 823 is turned on and a third switch 833 is turned off in the frequency band with center frequency $f_1$. In order to establish impedance matching in the frequency band with center frequency $f_1$, the ninth and tenth reactance circuits may be implemented by transmission lines with lengths of 22 mm and 7 mm, respectively. In the frequency band with center frequency $f_2$, On the other hand, the fourth switch 823 is turned off and the third switch 833 is turned on. In order to establish impedance matching in the frequency band with center frequency $f_2$, the seventh and eighth reactance circuits 831 and 832 must be implemented by transmission lines with lengths of 19 mm and 9 mm, respectively. The sum of the line lengths of the seventh and ninth reactance circuits 831 and 821 is 41 mm. Thus, a longer physical length of the transmission lines that form the ninth and seventh reactance circuits 821 and 831 is required as compared with that the multiband amplifier 700 shown in FIG. 15. In other words, it is apparent that the use of the matching circuit according to the present invention can reduce the size of the reactance circuits connected in series.

Figure 18:
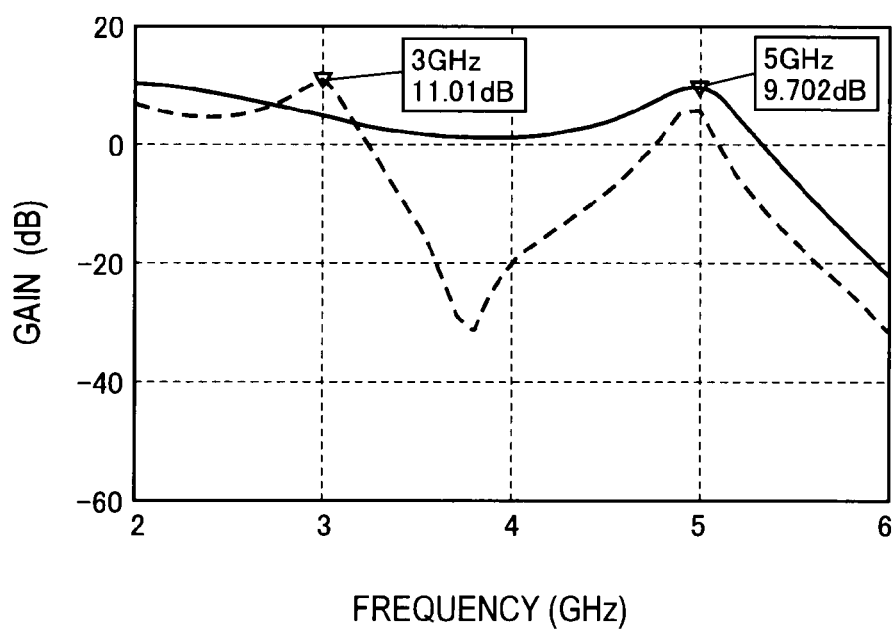
FIG. 18 shows a frequency characteristic in the gain of the multiband amplifier 800.

FIG. 18 shows the gain-frequency response of the multiband amplifier 800 shown in FIG. 17. Since the gains of the multiband amplifier 700 shown in FIG. 15 in each of two frequency bands are comparable to the gains of the multiband amplifier 800 shown in FIG. 17, it is apparent that, according to the configuration of the present invention, a matching circuit can be reduced in size while maintaining a good characteristic.

The matching circuit according to the present invention can be used in an AC circuit and not particularly limited to an AC frequency to be directed, but is useful in an AC circuit that operates in the quasi-microwave range to the microwave range, for example, that is, at high frequencies in the range from 100 MHz to 30 GHz.

One of ordinary skill in the art will recognize from the provided description, figures, and examples, that changes and modifications can be made to the various embodiments of the invention without departing from the scope of the invention defined by the claims and their equivalents. Various adaptations and combinations are within the scope of the invention as encompassed by the claims.

What is claimed is:

1. A matching circuit that performs impedance matching in each of N frequency bands between a circuit element having a frequency dependent impedance and a circuit having a constant impedance, the circuit defining a load, where N is a predetermined integer greater than or equal to 2, the matching circuit comprising:
   a first matching part one end of which is connected to said circuit element;
   a second matching part one end of which is connected to the other end of said first matching part; and
   a third matching part one end of which is connected to the other end of said second matching part and the other end of which is connected to said load, wherein
   said N is a predetermined even integer greater than or equal to 4;
   said first matching part comprises a reactance circuit $B_1$, a reactance circuit $B_2$, a variable reactance circuit $C_1$, a variable reactance circuit $C_2$, a switch $D_1$, a switch $D_2$, and a reactance circuit A one end of which is connected to said second matching part;
   one end of said reactance circuit $B_2$ is connected to the other end of said reactance circuit A;
   one end of said reactance circuit $B_1$ is connected to the other end of said reactance circuit $B_2$, said variable reactance circuit $C_1$ is connected to a connection point between said reactance circuit $B_1$ and said reactance circuit $B_2$ through said switch $D_1$, and said variable reactance circuit $C_2$ is connected to a connection point between said reactance circuit $B_2$ and said reactance circuit A through said switch $D_2$;
   said second matching part is an impedance converter operating in each of said N frequency bands and performs impedance matching between an impedance as viewed from a connection point between said second matching part and said first matching part toward said first matching part and said impedance of said load in each of N/2 frequency bands among said N frequency bands, the N/2 frequency bands defining a set of base frequency bands;
   said third matching part comprises a reactance circuit E defining said series reactance circuit, a switch G, and a variable reactance circuit F defining said parallel reactance circuit;
   one end of said reactance circuit E is connected to said second matching part;
   said variable reactance circuit F is connected through said switch G to the other end of said reactance circuit E connected to said load, and said reactance circuit E is configured so that an impedance as viewed from the other end of said third matching circuit toward said third matching part become equal to said impedance of said load in said set of base frequency bands;
   in said set of base frequency bands, one of said switch $D_1$ and said switch $D_2$ of said first matching part is brought into the conduction state and said switch G of said third matching part is brought into the non-conduction state;
   in frequency bands other than said set of base frequency bands, the other of said switch $D_1$ and said switch $D_2$ of said first matching part is brought into the conduction state; and said switch G of said third matching part is brought into the conduction state;
   said first matching part has reactance values obtained by four of said five reactance circuits determined by a conduction or non-conduction state of each of said two switches depending on each one of N frequency bands;
   said third matching part has reactance values obtained either by said series reactance circuit E, or by said series reactance circuit E and said parallel reactance circuit F that is/are determined by the conduction or non-conduction state of said switch G of said third matching part depending on each of said N frequency bands; and
   said series reactance circuit E of said third matching part is configured at least on a basis of an interdependence relation with a configuration of said five reactance circuits of said first matching part and said one parallel reactance circuit of said third matching part that depends on each of said N frequency bands.

2. The matching circuit according to claim 1, wherein
   said second matching part comprises a reactance circuit H one end of which is connected to said reactance circuit A and the other end of which is connected to said reactance circuit E and a variable reactance circuit I connected to a connection point between said reactance circuit H and said reactance circuit E through a switch J; and
   said switch J is brought into the conduction state in said set of base frequency bands and brought into the non-conduction state in said frequency bands other than said set of base frequency bands.

3. A matching circuit that performs impedance matching in each of N frequency bands between a circuit element having a frequency dependent impedance and a circuit having a constant impedance, the circuit defining a load, where N is a predetermined integer greater than or equal to 2, the matching circuit comprising:
   a first matching part one end of which is connected to said circuit element;
   a second matching part one end of which is connected to the other end of said first matching part; and
   a third matching part one end of which is connected to the other end of said second matching part and the other end of which is connected to said load, wherein
   letting k denote each integer greater than or equal to 1 and less than or equal to said N−1, said first matching part comprises one or more reactance circuits $B_k$, one or more reactance circuits $C_k$, at least one switch $D_k$, and reactance circuit A one end of which is connected to said second matching part;

one end of a reactance circuit $B_{N-1}$ is connected to the other end of said reactance circuit A;

when said N is greater than or equal to 3, letting r denote each integer greater than or equal to 1 and less than or equal to said N−2, one end of a reactance circuit $B_r$ is connected to the other end of a reactance circuit $B_{r+1}$, a reactance circuit $C_r$ is connected to a connection point $\alpha_r$ between the reactance circuit $B_r$ and the reactance circuit $B_{r+1}$ through a switch $D_r$, and a reactance circuit $C_{N-1}$ connected to a connection point $\alpha_{N-1}$ between the reactance circuit $B_{N-1}$ and said reactance circuit A through a switch $D_{N-1}$;

when said N is 2, a reactance circuit $C_1$ is connected to a connection point $\alpha_1$ between a reactance circuit $B_1$ and said reactance circuit A through a switch $D_1$;

said second matching part is an impedance converter operating in each of said N frequency bands and performs impedance matching between an impedance as viewed from a connection point between said second matching part and said first matching part toward said first matching part and said impedance of said load, in one of said N frequency bands, defining a base frequency band;

said third matching part comprises one or more reactance circuits $E_k$ each defining a series reactance circuit, at least one switch $G_k$, and one or more reactance circuits $F_k$ each defining a parallel reactance circuit;

one end of a reactance circuit $E_1$ is connected to said second matching part;

when said N is greater than or equal to 3, letting r denote each integer greater than or equal to 1 and less than or equal to said N−2, the other end of a reactance circuit $E_r$ is connected to one end of a reactance circuit $E_{r+1}$ and a reactance circuit $F_r$ is connected to a connection point between the reactance circuit Er and the reactance circuit $E_{r+1}$ through a switch $G_r$, a reactance circuit $F_{N-1}$ is connected through a switch $G_{N-1}$ to the other end of a reactance circuit $E_{N-1}$ connected to said load, and each said reactance circuit $E_k$ is configured so that an impedance as viewed from the other end of said third matching circuit toward said third matching part in said base frequency band is equal to said impedance of said load;

when said N is 2, a reactance circuit $F_1$ is connected to the other end of the reactance circuit $E_1$ through a switch $G_1$ and the reactance circuit $E_1$ is configured so that an impedance as viewed from the other end of said third matching circuit toward said third matching part in said base frequency band is equal to said impedance of said load;

in said base frequency band, only one of said at least one switch $D_k$ of said first matching part is brought into the conduction state and all said at least one switch $G_k$ of said third matching part are brought into the non-conduction state;

in one of said N frequency bands which is not said base frequency band, defining a second base frequency band, all said at least one switch $D_k$ of said first matching part are brought into the non-conduction state and only one of said at least one switch $G_k$ of said third matching part is brought into the conduction state;

in each of the N frequency bands other than said base frequency band and said second base frequency band, only one of said at least one switch $D_k$ of said first matching part is brought into the conduction state and only one of said at least one switch $G_k$ of said third matching part is brought into the conduction state;

said first matching part has reactance values obtained by at least two of said three or more reactance circuits determined by a conduction or non-conduction state of each of said at least one switch depending on each one of N frequency bands;

said third matching part has reactance values obtained either by at least one of said one or more series reactance circuits, or by at least one or more series reactance circuits and at least one of said one or more parallel reactance circuits that is/are determined by the conduction or non-conduction state of each of said at least one switch of said third matching part depending on each of said N frequency bands; and said one or more series reactance circuits of said third matching part are configured at least on a basis of an interdependence relation with a configuration of said two or more reactance circuits of said first matching part and said one or more parallel reactance circuits of said third matching part that depends on each of said N frequency bands.

4. The matching circuit according to claim 3, wherein
in N frequency bands $b_1, b_2, \ldots, b_N$ with center frequencies $f_1, f_2, \ldots, f_N$, where $f_1 > f_2 > \ldots > f_N$,
said frequency band $b_1$ is said base frequency band;
said frequency band $b_N$ is said second base frequency band;
in said frequency band $b_1$, only said switch $D_1$ of said first matching part is brought into the conduction state and all said at least one switch $G_k$ of said third matching part are brought into the non-conduction state;
in said frequency band $b_N$, all said at least one switch $D_k$ of said first matching part are brought into the non-conduction state and only said switch $G_{N-1}$ of said third matching part is brought into the conduction state;
when said N is greater that or equal to 3, letting g denote each integer greater than or equal to 2 and less than or equal to said N−1, for impedance matching in the frequency band $b_g$, only a switch $D_g$ of said first matching part is brought into the conduction state and only a switch $G_{g-1}$ of said third matching part is brought into the conduction state; and
each said reactance circuit $B_k$ is configured so that, in a frequency band $b_k$, an admittance as viewed from a connection point $\alpha_k$ toward said reactance circuit $B_1$ is approximately 0.

5. The matching circuit according to claim 3 or 4, wherein each connection point $\alpha_k$ is a portion that is a node of alternating current in a k-th frequency band.

6. A matching circuit that performs impedance matching in each of N frequency bands between a circuit element having a frequency dependent impedance and a circuit having a constant impedance, the circuit defining a load, where N is a predetermined integer greater than or equal to 2, the matching circuit comprising:

a first matching part one end of which is connected to said circuit element;

a second matching part one end of which is connected to the other end of said first matching part; and a third matching part one end of which is connected to the other end of said second matching part and the other end of which is connected to said load, wherein letting i denote each integer greater than or equal to 1 and less than or equal to said N and k denote each integer greater than or equal to 1 and less than or equal to N−1, said first matching part comprises a plurality of reactance circuits $B_i$, a plurality of reactance circuits $C_i$, two or more switches $D_i$, and a reactance circuit A one end of which is connected to said second matching part;

one end of a reactance circuit $B_N$ is connected to the other end of said reactance circuit A;

one end of a reactance circuit $B_k$ is connected to the other end of a reactance circuit $B_{k+1}$, a reactance circuit $C_k$ is connected to a connection point $\alpha_k$ between the reactance circuit $B_k$ and the reactance circuit $B_{k+1}$ through a switch $D_k$, and a reactance circuit $C_N$ is connected to a connection point $\alpha_N$ between the reactance circuit $B_N$ and said reactance circuit A through a switch $D_N$;

said second matching part is an impedance converter operating in each of said N frequency bands and performs impedance matching between an impedance as viewed from a connection point between said second matching part and said first matching part toward said first matching part and said impedance of said load in one of said N frequency bands, defining a base frequency band;

said third matching part comprises one or more reactance circuits $E_k$ each defining a series reactance circuit, at least one switch $G_k$, and one or more reactance circuits $F_k$ each defining a parallel reactance circuit;

one end of a reactance circuit $E_1$ is connected to said second matching part;

when said N is greater than or equal to 3, letting j denote each integer greater than or equal to 1 and less than or equal to said N−2, the other end of a reactance circuit $E_j$ is connected to one end of a reactance circuit $E_{j+1}$ and a reactance circuit $F_j$ is connected to a connection point between the reactance circuit $E_j$ and the reactance circuit $E_{j+1}$ through a switch $G_j$, a reactance circuit $F_{N-1}$ is connected through a switch $G_{N-1}$ to the other end of a reactance circuit $E_{N-1}$ connected to said load, and each said reactance circuit $E_k$ is configured so that an impedance as viewed from the other end of said third matching circuit toward said third matching part in said base frequency band is equal to said impedance of said load;

when said N is 2, a reactance circuit $F_1$ is connected to the other end of the reactance circuit $E_1$ through a switch $G_1$ and the reactance circuit $E_1$ is configured so that an impedance as viewed from the other end of said third matching circuit toward said third matching part in said base frequency band is equal to said impedance of said load;

in said base frequency band, only one of said two or more switches $D_i$ of said first matching part is brought into the conduction state and all said at least one switch $G_k$ of said third matching part are brought into the non-conduction state;

in each of the N frequency bands other than said base frequency band, only one of said two or more switches $D_i$ of said first matching part is brought into the conduction state and only one of said at least one switch $G_k$ of said third matching part is brought into the conduction state;

said first matching part has reactance values obtained by at least four of said five or more reactance circuits determined by a conduction or non-conduction state of each of said at least one switch depending on each one of N frequency bands;

said third matching part has reactance values obtained either by at least one of said one or more series reactance circuits, or by at least one or more series reactance circuits and at least one of said one or more parallel reactance circuits that is/are determined by the conduction or non-conduction state of each of said at least one switch of said third matching part depending on each of said N frequency bands; and said one or more series reactance circuits of said third matching part are configured at least on a basis of an interdependence relation with a configuration of said two or more reactance circuits of said first matching part and said one or more parallel reactance circuits of said third matching part that depends on each of said N frequency bands.

7. The matching circuit according to claim 6, wherein in N frequency bands $b_1, b_2, \ldots, b_N$ with center frequencies $f_1, f_2, \ldots, f_N$, where $f_1 > f_2 > \ldots > f_N$, said frequency band $b_1$ is said base frequency band;

in said frequency band $b_1$, only a switch $D_1$ of said first matching part is brought into the conduction state and all said at least one switch $G_k$ of said third matching part are brought into the non-conduction state;

letting g denote each integer greater than or equal to 2 and less than or equal to said N, for impedance matching in a frequency band $b_g$ only a switch $D_g$ of said first matching part is brought into the conduction state and only a switch $G_{g-1}$ of said third matching part is brought into the conduction state; and each said reactance circuit $B_1$ is configured so that, in said frequency band $b_i$, an admittance as viewed from a connection point $\alpha$ toward a reactance circuit $B_1$ is approximately 0.

8. The matching circuit according to claim 6 or 7, wherein each connection point $\alpha_i$ is a portion that is a node of alternating current in an i-th frequency band.

9. The matching circuit according to claim 8, wherein said second matching part comprises a reactance circuit H one end of which is connected to said reactance circuit A and the other end of which is connected to said reactance circuit $E_1$ and a variable reactance circuit I connected to a connection point between said reactance circuit H and said reactance circuit $E_1$ through a switch J; and said switch J is brought into the conduction state in said set of base frequency bands and brought into the non-conduction state in said frequency bands other than said set of base frequency bands.

10. The matching circuit according to any of claims 6, 7, or 3, wherein said second matching part comprises a reactance circuit H one end of which is connected to said reactance circuit A and the other end of which is connected to said reactance circuit $E_1$ and a reactance circuit I connected to a connection point between said reactance circuit H and said reactance circuit $E_1$ through a switch J; and said switch J is brought into the conduction state in said base frequency band and brought into the non-conduction state in each of the N frequency bands other than said base frequency band.

* * * * *